(12) United States Patent
Yamaguchi

(10) Patent No.: US 11,672,121 B2
(45) Date of Patent: Jun. 6, 2023

(54) SEMICONDUCTOR MEMORY DEVICE INCLUDING SEPARATED EPITAXIAL LAYERS

(71) Applicant: RENESAS ELECTRONICS CORPORATION, Tokyo (JP)

(72) Inventor: Tadashi Yamaguchi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 440 days.

(21) Appl. No.: 16/805,447

(22) Filed: Feb. 28, 2020

(65) Prior Publication Data

US 2020/0279856 A1  Sep. 3, 2020

(30) Foreign Application Priority Data

Mar. 1, 2019  (JP) .............................. JP2019-037315

(51) Int. Cl.
| | |
|---|---|
| *H01L 27/11568* | (2017.01) |
| *H01L 27/11573* | (2017.01) |
| *H01L 29/45* | (2006.01) |
| *H01L 29/66* | (2006.01) |
| *H01L 29/792* | (2006.01) |
| *H01L 21/285* | (2006.01) |
| *H01L 29/78* | (2006.01) |

(52) U.S. Cl.
CPC .. *H01L 27/11568* (2013.01); *H01L 21/28518* (2013.01); *H01L 27/11573* (2013.01); *H01L 29/45* (2013.01); *H01L 29/66795* (2013.01); *H01L 29/66833* (2013.01); *H01L 29/7851* (2013.01); *H01L 29/792* (2013.01)

(58) Field of Classification Search
CPC ......... H01L 27/11568; H01L 21/28518; H01L 27/11573; H01L 29/45; H01L 29/66795; H01L 29/66833; H01L 29/7851; H01L 29/792

See application file for complete search history.

(56) References Cited

U.S. PATENT DOCUMENTS

| | | | |
|---|---|---|---|
| 9,583,641 B1* | 2/2017 | Chang | ............... H01L 29/66545 |
| 11,189,706 B2* | 11/2021 | Yao | ...................... H01L 29/4991 |
| 2017/0358592 A1 | 12/2017 | Yamaguchi | |
| 2020/0126981 A1* | 4/2020 | Chang | ............... H01L 29/66795 |

FOREIGN PATENT DOCUMENTS

| | | | | |
|---|---|---|---|---|
| CN | 111243959 A | * | 6/2020 | ....... H01L 21/30604 |
| CN | 113314609 A | * | 8/2021 | ....... H01L 21/30608 |
| DE | 102020114314 A1 | * | 11/2021 | ....... H01L 21/02164 |
| JP | 2017-224666 A | | 12/2017 | |
| JP | 2017224666 A | * | 12/2017 | ......... H01L 21/2855 |

* cited by examiner

*Primary Examiner* — Peter Bradford
(74) *Attorney, Agent, or Firm* — McDermott Will & Emery LLP

(57) ABSTRACT

In a semiconductor device having MONOS memories configured by fin-type MISFETs, an increase in parasitic capacitance between wirings accompanying miniaturization of the semiconductor device is prevented, and the reliability of the semiconductor device is improved. In a memory cell array in which a plurality of MONOS type memory cells formed on fins are arranged, source regions formed on the plurality of fins arranged in a short direction of the fin are electrically connected to each other by one epitaxial layer straddling the fins.

8 Claims, 42 Drawing Sheets

FIG. 41

| OPERATION \ APPLIED VOLTAGE | Vd | Vcg | Vmg | Vs | Vb |
|---|---|---|---|---|---|
| WRITE | Vdd | 1V | 12V | 6V | 0 |
| ERASE | 0 | 0 | -6V | 6V | 0 |
| READ | Vdd | Vdd | 0 | 0 | 0 |

Vdd = 1.5V

SEMICONDUCTOR MEMORY DEVICE INCLUDING SEPARATED EPITAXIAL LAYERS

CROSS-REFERENCE TO RELATED APPLICATIONS

The disclosure of Japanese Patent Application No. 2019-037315 filed on Mar. 1, 2019 including the specification, drawings and abstract is incorporated herein by reference in its entirety.

BACKGROUND

The present invention relates to a semiconductor device and a method of manufacturing the same, and more particularly, the present invention relates to a technique which is useful when applied to a semiconductor device including a fin-type transistor.

A fin transistor is known as a transistor which has a high operating speed and can reduce leakage current and power consumption and can be miniaturized. The fin-type field effect transistor (FINFET: Fin Field Effect Transistor) is, for example, a semiconductor device having a pattern of a plate-like (wall-like) semiconductor layer protruded on a substrate as a channel layer, and having a gate electrode formed so as to straddle the pattern.

In addition, EEPROM (Electrically Erasable and Programmable Read Only Memory) is widely used as a non-volatile semiconductor memory device capable of electrically writing and erasing. The memory device typified by a flash memory widely used at present has a conductive floating gate electrode or a trapping dielectric film surrounded by oxide films under a gate electrode of a MISFET, and the charge storage state of the floating gate or the trapping dielectric film is used as memory information, and the stored information is read out as a threshold value of a transistor. The trapping dielectric film refers to a dielectric film capable of storing charges, and as an example, a silicon nitride film or the like can be given. By injecting and discharging charges into and from the charge storage regions, the threshold value of the MISFET is shifted to operate as a memory device. As the flash memory, there is a split-gate type cell using a MONOS (Metal-Oxide-Nitride-Oxide-Semiconductor) film.

There are disclosed techniques listed below.
[Patent Document 1] Japanese Unexamined Patent Application Publication No. 2017-224666

Patent Document 1 discloses forming a silicide layer covering a surface of a fin on which a split-gate type MONOS memory is formed, and forming an epitaxial layer covering a surface of a fin on which a FET is formed in a logic circuit region.

SUMMARY

In FINFET, the fin serving as the active layer is thin. Therefore, in order to prevent an increase in contact resistance between the plug and the fin, an epitaxial layer is formed on the surface of the fin in which the source/drain regions of the transistor are formed, and the plug is connected to the epitaxial layer in some cases.

On the other hand, as the semiconductor device is miniaturized, the line capacitance between source lines, which are wirings over the device, increases, and the operation delay of the semiconductor device occurs. In addition, when the epitaxial layer is individually formed on each of a plurality of fins arranged in the short direction of the fins and the plug is connected to each of the epitaxial layers, poor formation of plugs is liable to occur as the interval between the plugs is reduced.

Other objects and novel features will be apparent from the description of this specification and the accompanying drawings.

The typical ones of the embodiments disclosed in the present application will be briefly described as follows.

In a semiconductor device according to embodiments, in MONOS memories formed on upper portions of fins, source regions formed in the plurality of fins arranged in the short direction of the fins are electrically connected to each other by one epitaxial layer extending over the fins, and epitaxial layers covering drain regions having upper surfaces lower than upper surfaces of the source regions are separated from each other between the adjacent fins in the short direction of the fin.

According to the embodiments disclosed in the present application, the reliability of the semiconductor device can be improved.

BRIEF DESCRIPTION OF THE DRAWINGS

FIG. 41 is a table showing an example of a condition for applying a voltage to each portion of the selected memory cell at the time of "write", "erase" and "read".

DETAILED DESCRIPTION

Figure 1:
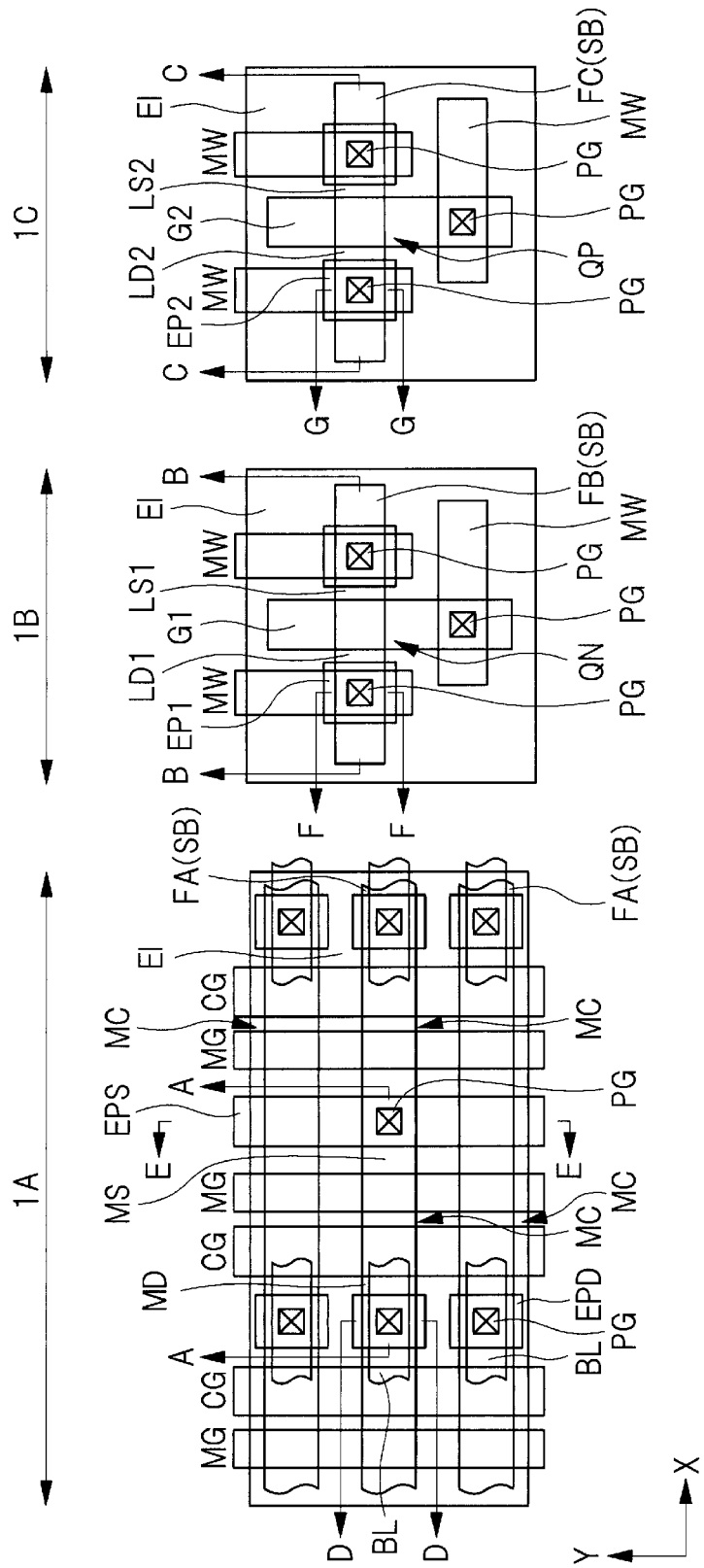
FIG. 1 is a plan view showing a semiconductor device according to an embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, an embodiment will be described in detail with reference to the drawings. In all the drawings for explaining the embodiment, members having the same functions are denoted by the same reference numerals, and repetitive descriptions thereof are omitted. In the following embodiment, descriptions of the same or similar parts will not be repeated in principle except when particularly necessary.

"−" and "+" are signs representing relative impurity concentrations of n-type or p-type conductivity, and the impurity concentration of n-type impurity increases in the order of "n−", "n", "n+", for example.

Hereinafter, a semiconductor device having a nonvolatile memory in the present embodiment will be described. A semiconductor chip in the present embodiment includes a CPU (Central Processing Unit), a RAM (Random Access Memory), and an analogue circuit. Further, the semiconductor chip in the present embodiment includes an EEPROM (Electrically Erasable Programmable Read Only Memory, a flash memory, and an I/O (Input/Output) circuit, and configures a semiconductor device.

The CPU (circuit) is also called a central processing device, and reads and decodes instructions from storage devices, and performs various operations and controls based on the instructions. The RAM (circuit) is a memory in which memory information can be written and read as needed. As the RAM, a SRAM (Static RAM) using static circuits is used. The analog circuit is a circuit that handles signals of voltage and current that continuously change in time, that is, analog signals, and is configured by, for example, an amplifier circuit, a conversion circuit, a modulation circuit, an oscillation circuit, a power supply circuit, and the like.

EEPROM and flash memory are a type of nonvolatile memory in which memory information can be electrically rewritten in a write operation and an erase operation, and are also referred to as electrically erasable programmable read only memory. The memory cells of the EEPROM and the flash memory are configured by, for example, a MONOS (Metal Oxide Nitride Oxide Semiconductor) type transistor or a MNOS (Metal Nitride Oxide Semiconductor) type transistor for storage (memory).

The I/O circuit is an input/output circuit for outputting data from the semiconductor chip to a device connected to the outside of the semiconductor chip, or inputting data from a device connected to the outside of the semiconductor chip to the semiconductor chip.

The semiconductor device of the present embodiment has a memory cell region and a logic circuit region. In the memory cell region, a memory cell array in which a plurality of nonvolatile memory cells are arranged in a matrix is formed. In the logic circuit region, CPU, RAM, analogue circuits, I/O circuits, address buffers of EEPROM or flash memories, row decoders, column decoders, verify sense amplifier circuits, sense amplifier circuits, write circuits, and the like are formed.

Device Structure of Semiconductor Device

Figure 2:
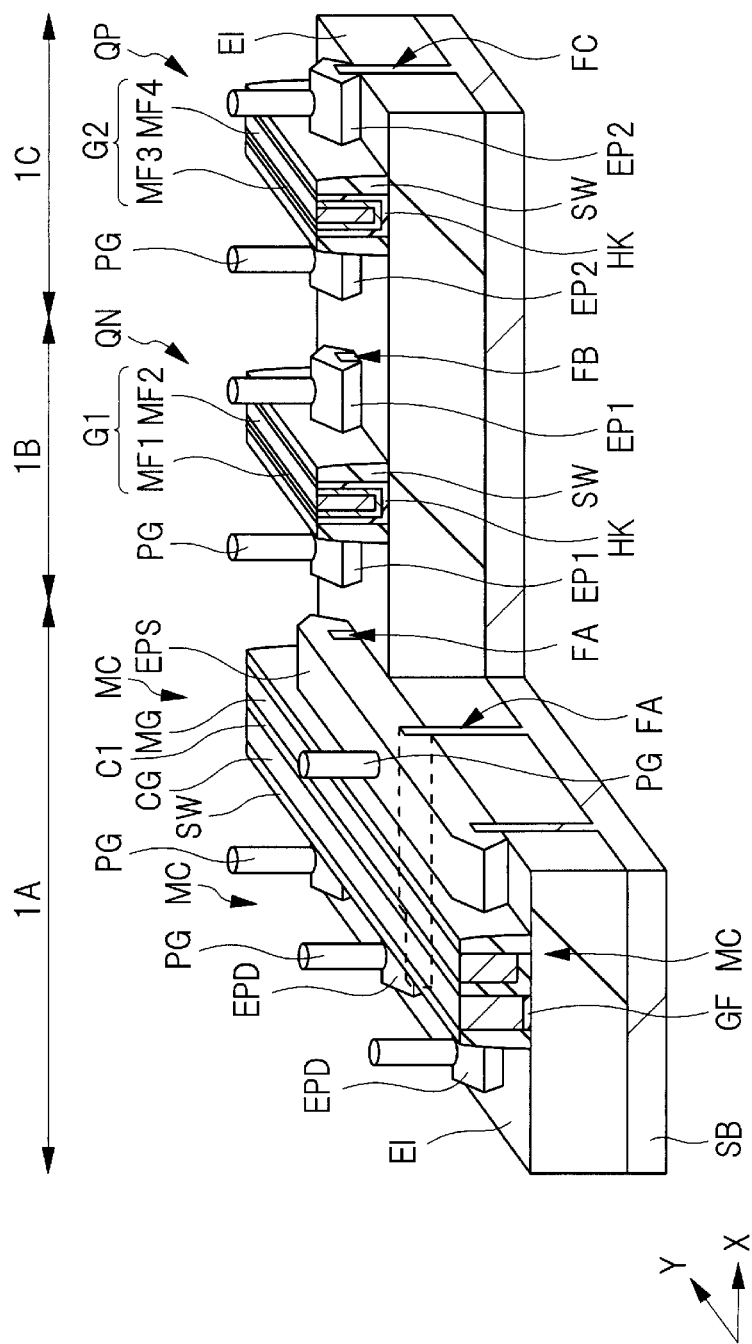
FIG. 2 is a perspective view showing the semiconductor device according to the embodiment.

Next, with reference to FIG. 1 to FIG. 4, the structure of the semiconductor device of the present embodiment will be described. FIG. 1 is a plan view of the semiconductor device in the present embodiment. FIG. 2 is a perspective view of the semiconductor device in the present embodiment. FIG.

Figure 4:
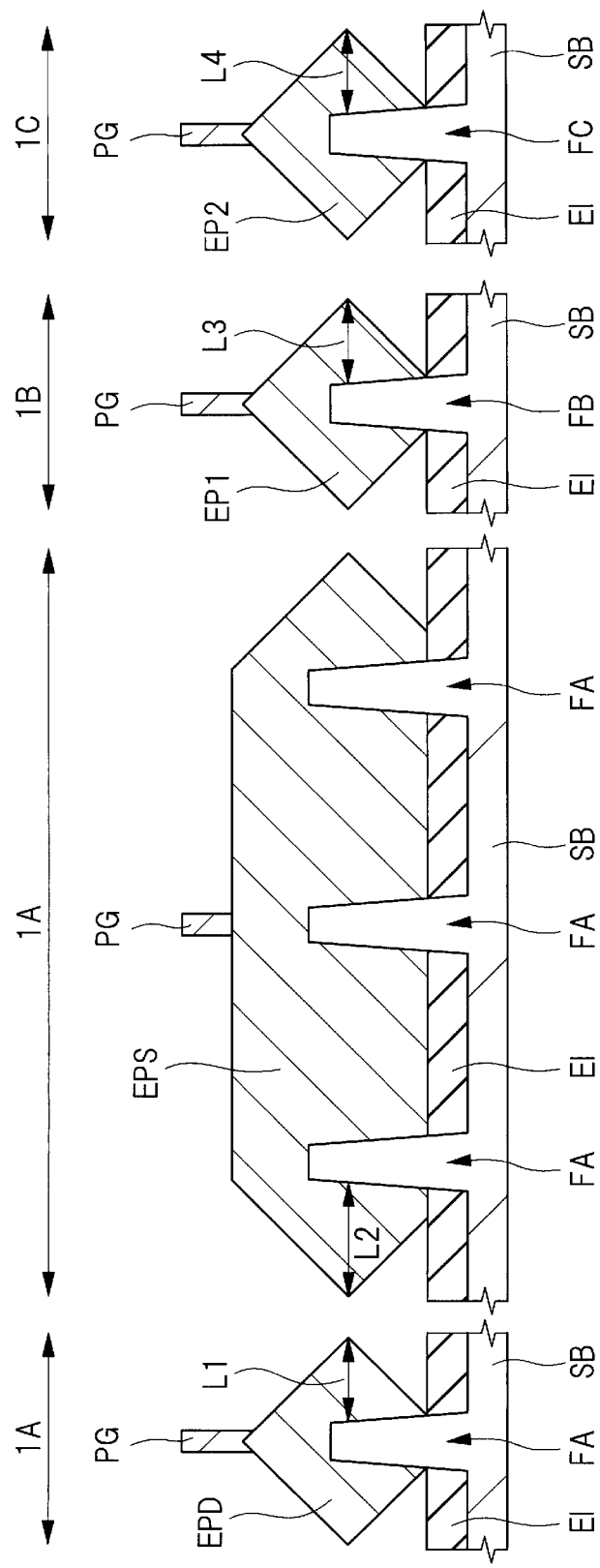
FIG. 4 is a cross-sectional view showing the semiconductor device according to the embodiment.

3 and FIG. 4 are cross-sectional view of the semiconductor device in the present embodiment. In FIG. 2 and FIG. 4, a well, source/drain regions, and silicide layers are not shown.

In FIG. 1, the plan view of the memory cell array is shown in the memory cell region 1A, the plan view of the n-type transistor QN configuring the logic circuit or the like of the logic circuit region is shown in the nMIS region 1B, and the plan view of the p-type transistor QP configuring the logic circuit or the like of the logic circuit region is shown in the pMIS region 1C. As the n-type transistor QN, an n-type MISFET (Metal Insulator Semiconductor Field Effect Transistor, MIS-type field effect transistor) is formed. As the p-type transistor QP, a p-type MISFET is formed. In the present application, the n-type MISFET is sometimes referred to as nMIS, and the p-type MISFET is sometimes referred to as pMIS.

The memory cell MC in the memory cell region 1A is formed in, for example, the flash memory. The n-type transistor QN in the nMIS region 1B and the p-type transistor QP in the pMIS region 1C are formed in, for example, the RAM or CPU described above.

As shown in FIG. 1, in the memory cell region 1A, a plurality of fins FA extending in X direction are arranged at equal intervals in Y direction. Each of the X direction and the Y direction is a direction along the upper surface (main surface) of the semiconductor substrate SB, and the X direction is perpendicular (crossing) to the Y direction in plan view. The fin FA is, for example, a rectangular parallelepiped protruding portion (projections) selectively protruded from the upper surface of the semiconductor substrate SB, and have a plate-like (wall-like) shape. The lower end portion of the fin FA is surrounded by an element isolation region EI covering the upper surface of the semiconductor substrate SB. The fin FA is part of the semiconductor substrate SB and is an active region of the semiconductor substrate SB. In plan view, the space between adjacent fins FA is embedded with an element isolation region EI, and the periphery of the fin FA is surrounded by the element isolation region EI. The fin FA is an active region for forming the memory cell MC.

A plurality of control gate electrodes CG and a plurality of memory gate electrodes MG extending in the Y direction are arranged on the plurality of fins FA so as to straddle the fins FA. A drain region MD on the control gate electrode CG side and a source region MS on the memory gate electrode MG side are formed in the upper surface and side surfaces of the fin FA so as to sandwich the control gate electrode CG and the memory gate electrode MG. That is, in the X direction, one control gate electrode CG and one memory gate electrode MG adjacent to each other are located between the source region MS and the drain region MD.

The drain region MD and the source region MS are n-type semiconductor regions formed from the upper surface and side surfaces of the fin FA to the inside of the fin FA.

In plan view, the drain region MD is formed from the upper surface and side surfaces of each of the plurality of fins FA adjacent to the control gate electrodes CG to the inside of the fins FA. The fin FA adjacent to the control gate electrode CG here is a portion of the fin FA on the opposite side of the memory gate electrode MG adjacent to the control gate electrode CG among the fin FA adjacent to the control gate electrode CG in plan view. In the present application, the fin FA adjacent to the control gate electrode CG may be referred to as a fin FA on the side of the control gate electrode CG.

In plan view, the source region MS is formed from the upper surface and the side surface of each of the plurality of fins FA adjacent to the memory gate electrodes MG to the inside of the fins FA. The fin FA adjacent to the memory gate electrode MG here is a portion of the fin FA on the side opposite to the control gate electrode CG adjacent to the memory gate electrode MG among the fin FA adjacent to the memory gate electrode MG in plan view. In the present application, the fin FA adjacent to the memory gate electrode MG may be referred to as a fin FA on the side of the memory gate electrode MG.

The drain region MD is formed between two adjacent control gate electrodes CG in the X direction, and the source region MS is formed between two adjacent memory gate electrodes MG in the X direction, in plan view. The memory cell MC is a nonvolatile memory element having a control gate electrode CG, a memory gate electrode MG, a drain region MD, and a source region MS. In the present application, a source region and a drain region configuring one memory cell or one transistor are sometimes referred to as a source/drain region.

Two memory cells MC adjacent to each other in the X direction share a drain region MD or a source region MS. Two memory cells MC sharing the drain region MD have a layout of line symmetry in the X direction about an axis extending in the Y direction through the drain region MD in plan view, and two memory cells MC sharing the source region MS have a layout of line symmetry in the X direction about an axis extending in the Y direction through the source region MS in plan view.

That is, a plurality of memory cells MC arranged in the X direction are formed in each fin FA. The source region MS of each of the memory cells MC is electrically connected to the wiring (not shown) over the memory cells MC, to which a source potential is supplied via the plug (contact plug, conductive connecting portion) PG formed in a contact hole penetrating an interlayer insulating film (not shown) formed on the memory cells MC. The plurality of drain regions MD of the plurality of memory cells MC arranged in the Y direction are electrically connected to a bit line BL formed of a wiring extending in the X direction.

Fins FB extending in the X direction, for example, are formed in the nMIS region 1B. The fin FB is part of the semiconductor substrate SB similarly to the fin FA, and has a plate shape (wall shape) protruded from the upper surface of the semiconductor substrate SB. The fin FB is an active region of the semiconductor substrate SB, and the lower end portion of the fin FB is surrounded by an element isolation region EI covering the upper surface of the semiconductor substrate SB. A gate electrode G1 extending in the Y direction is arranged on the fin FB so as to straddle the fin FB, and a drain region LD1 and a source region LS1 are formed in an upper surface and side surfaces of the fin FB so as to sandwich the gate electrode G1. The drain region LD1 and the source region LS1 are n-type semiconductor regions formed in the fin FB.

The n-type transistor QN includes the gate electrode G1, the drain region LD1, and the source region LS1. The gate electrode G1, the drain region LD1, and the source region LS1 are electrically connected to the wiring MW via plugs PG formed in the contact holes, respectively. The fin FB is an active region for forming the n-type transistor QN.

In addition, fins FC extending in the X direction and p-type transistors QP on the fins FC are formed in the pMIS region 1C. The layout of the p-type transistor QP configured by the gate electrode G2, the drain region LD2, and the source region LS2 is the same as the layout of the n-type transistor QN, for example. However, the drain region LD2 and the source region LS2 are p-type semiconductor regions formed in the fins FC.

Although one n-type transistor QN and one p-type transistor QP are shown in FIG. 1, a plurality of transistors may be arranged side by side in the X direction on one fin. Although not shown, a plurality of fins FB are arranged in the Y direction in the nMIS region 1B, and a plurality of n-type transistors QN are also arranged in the Y direction. Similarly, in the pMIS region 1C, a plurality of fins FC are arranged side by side in the Y direction, and a plurality of p-type transistors QP are also arranged in the Y direction.

The fins FA, FB and FC are, for example, rectangular parallelepiped protruding portions which protrude from the upper surface of the semiconductor substrate SB in a direction perpendicular to the upper surface. In other words, the fins FA, FB and FC are protruded upwardly from the bottom of the trench around each of the fins FA, FB and FC. However, the fins FA, FB, and FC do not necessarily have to be rectangular parallelepipeds, and the corners of the rectangle may be rounded in plan view in the short direction. Also, the sides of the fins FA, FB, and FC may be perpendicular to the upper surface of the semiconductor substrate SB, but may have tilt angles close to perpendicular, as shown in FIG. 4. That is, the cross-sectional shape of each of the fins FA, FB, and FC is a rectangular parallelepiped or a trapezoid. Here, the sides of the fins FA, FB and FC are inclined obliquely with respect to the upper surface of the semiconductor substrate SB.

As shown in FIG. 1, the direction in which the fins FA, FB, and FC extend in plan view is the long direction (long side direction) of each fin, and the direction orthogonal to the long direction is the short direction (short side direction) of each fin. That is, the length of the fin in the X direction is larger than the width of the fin in the Y direction. The fins FA, FB, and FC may have any shape as long as they are protruding portions having a length, a width, and a height. For example, the fins may have a serpentine layout in plan view.

A plurality of wirings MW are arranged over each of the n-type transistor QN and the p-type transistor QP, and the drain region LD1 and the source region LS1 in the nMIS region 1B are electrically connected to the wirings MW via plugs PG. The drain region LD2 and the source region LS2 in the pMIS region 1C are electrically connected to the wirings MW via plugs PG. Each of the gate electrodes G1 and G2 is electrically connected to the wiring MW via the plug PG. Each of the control gate electrodes CG and the memory gate electrodes MG is also electrically connected to the wiring via the plug PG in regions not shown.

Here, the fins are electrically connected to the plugs PG on the fins via epitaxial layers (semiconductor layers, epitaxial growth layers, raised portions) covering the upper surface and side surfaces of the fins. For example, the drain region MD formed in the fin FA is electrically connected to the plug PG on the fin via the epitaxial layer EPD covering the upper surface and side surfaces of the fin FA. The source region MS formed in the fin FA is electrically connected to the plug PG on the fin via the epitaxial layer EPS covering the upper surface and side surfaces of the fin FA. The drain region LD1 and the source region LS1 formed in the fin FB are electrically connected to the plugs PG on the fin via epitaxial layers EP1 covering the upper surface and the side surfaces of the fin FB, respectively. The drain region LD2 and the source region LS2 formed in the fin FC are electrically connected to the plugs PG on the fin via epitaxial layers EP2 covering the upper surface and the side surfaces of the fin FC, respectively.

This is to prevent the contact resistance between the plug and the fin from increasing when the plug is directly connected to the fin having a small width in the short direction (Y direction). Here, the contact resistance is reduced by connecting a plug to an epitaxial layer having a larger width in the Y direction than the fin. Each epitaxial layer has an impurity concentration equivalent to that of the source/drain regions in the fin, and configures a part of the source/drain regions of each transistor. For example, the epitaxial layer EPD is part of the drain region MD.

The epitaxial layers EPD, EP1, and EP2 covering the predetermined fins and configuring the drain regions MD, LD1, LD2, the source regions LS1 and LS2, respectively, are not in contact with the epitaxial layers covering the other fins adjacent to each other in the Y direction. That is, the epitaxial layers EPD are separately formed on each of the fins FA arranged in the Y direction, and one epitaxial layer EPD is not connected to both of the two fins FA adjacent to each other in the Y direction. In other words, the two epitaxial layers EPD covering the two fins FA adjacent to each other in the Y direction are separated from each other. This also applies to the epitaxial layers EP1 and EP2 configuring the drain regions MD, LD1, LD2, the source regions LS1 and LS2, respectively.

On the other hand, as one of the main features of the present embodiment, the epitaxial layer EPS covering the portion of the fin FA where the source region MS is formed, is integrated with the epitaxial layer EPS covering the other fin FA adjacent in the Y direction. In other words, one epitaxial layer EPS is in contact with each of the plurality of fins FA arranged in the Y direction, and the source region MS formed in each of the plurality of fins FA is electrically connected to each other via the epitaxial layer EPS. That is, the epitaxial layer EPD extends in the Y direction and is formed so as to straddle the plurality of fins FA.

Although FIG. 1 shows an example in which the plug PG connected to the epitaxial layer EPS is arranged on the fin FA, the plug PG may be arranged on a region between the fins FA adjacent to each other in the Y direction. The plug PG may be connected to the epitaxial layer EPS outside the memory cell array in the Y direction.

The bit line BL electrically connected to the epitaxial layer EPD via the plug PG is formed on the fin FB under the bit line BL, is electrically connected to each of the plurality of drain regions MD arranged in the X direction, and extends in the X direction along the fin FB under the bit line BL in the memory cell array. That is, a plurality of bit lines BL extending in the X direction are arranged in a stripe shape in the Y direction over the memory cell array.

On the other hand, since the source regions MS formed in each of the plurality of fins FA are electrically connected to each other via the epitaxial layer EPS extending in the Y direction in the memory cell array, the wirings (source lines) electrically connected to the epitaxial layer EPS via the plugs PG need not be arranged in a stripe shape as in the case of the bit lines. In other words, a plurality of wirings extending in the Y direction need not be arranged in the X direction over the memory cell array in order to supply a potential to the source region MS. Therefore, if only the minimum lead line electrically connected to the epitaxial layers EPS is formed as the wiring, the source potential can be supplied to each of the memory cells MCs arranged in the Y-direction.

Figure 3:
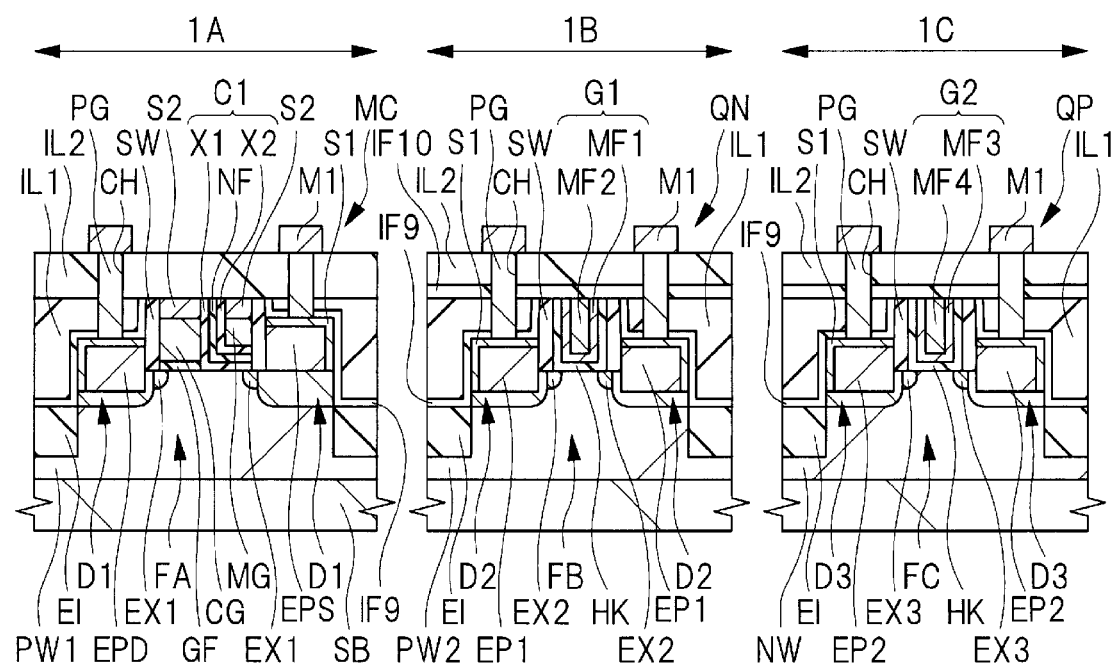
FIG. 3 is a cross-sectional view showing the semiconductor device according to the embodiment.

In FIG. 2 to FIG. 4, the memory cell region 1A, nMIS region 1B and the pMIS region 1C are shown side by side in order from the left side to the right side. In FIG. 2, the silicide layers, interlayer insulating films, and wirings on the respective elements are not shown. In FIG. 2, the outline of a portion of the fins FA on the element isolation region EI of the memory cell region 1A, which is covered with the gate electrode or the like, is shown by a broken line. In FIG. 2, the stacked structure of the insulating film (ONO film) C1 is omitted, and the insulating film C1 is shown as one film. A memory cell MC is formed on the fin FA configuring the semiconductor substrate SB in the memory cell region 1A, an n-type transistor QN is formed on the fin FB configuring the semiconductor substrate SB in the nMIS region 1B, and a p-type transistor QP is formed on the fin FC configuring the semiconductor substrate SB in the pMIS region 1C.

FIG. 3 is a cross-sectional view of the semiconductor device taken along line A-A, line B-B, and line C-C of FIG. 1. FIG. 4 is a cross-sectional view of the semiconductor device taken along line D-D, line E-E, line F-F, and line G-G of FIG. 1. Although a plurality of elements are formed on one fin side by side in the long direction of the fin, only one element is shown on the fin in FIG. 2 and FIG. 3.

As shown in FIG. 2, the control gate electrode CG and the memory gate electrode MG extend in the Y direction so as to straddle the fin FA, the gate electrode G1 extends in the Y direction so as to straddle the fin FB, and the gate electrode G2 extends in the Y direction so as to straddle the fin FC. The upper surface of each of the control gate electrode CG and the memory gate electrode MG is covered with a silicide layer S2. The silicide layers S2 are formed of, for example, nickel silicide (NiSi). The silicide layer S2 may contain Pt (platinum).

As shown in FIG. 2 to FIG. 4, the upper surface and side surfaces of the fins FA in the portions where the diffusion regions D1 configuring the drain regions in the memory cell region 1A are formed, are covered with epitaxial layers (semiconductor layers) EPD. In addition, the upper surface and side surfaces of the fins FA in the portions where the diffusion regions D1 configuring the source regions in the memory cell region 1A are formed, are covered with an epitaxial layer (semiconductor layer) EPS. The side surface and the upper surface of the fins FB on which the diffusion regions D2 configuring the source/drain regions in the nMIS region 1B are formed, are covered with an epitaxial layer (semiconductor layer) EP1. Similarly, the side surfaces and the upper surface of the fins FC in which the diffusion regions D3 configuring the source/drain regions in the pMIS regions 1C are formed, are covered with an epitaxial layer (semiconductor layer) EP2. The epitaxial layers EPD, EPS, EP1, and EP2 are formed on the element isolation regions EI.

Each of the epitaxial layers EPD, EP1, and EP2 formed by epitaxial growth method has a rhombic shape in a cross section along the Y direction (see FIG. 4). For example, the side surfaces of the epitaxial layers EPD in the memory cell regions 1A, which are not in contact with the fins FA, have a lower side surface and an upper side surface. The side surface of the lower side surface has an incline away from the fin FB in a direction along the upper surface of the semiconductor substrate SB from the element isolation region EI side toward the upper side, and the side surface of the upper side surface has an incline toward the fin FB in a direction along the upper surface of the semiconductor substrate SB from the element isolation region EI side toward the upper side. The upper end portion of the lower side surface is connected to the lower end portion of the upper side surface.

In other words, in the Y direction, the width between the left end portion and the right end portion of the epitaxial layer EPD is larger at the center between the upper end and the lower end of the epitaxial layer EPD than the upper end portion and the lower end portion of the epitaxial layer EP1. The epitaxial layer EP1, EP2 has the similar shape as that of the epitaxial layer EPD.

On the other hand, in the epitaxial layer EPS formed by epitaxial growth method, the semiconductor layers grown from the surfaces of the plurality of fins FA arranged in the Y direction are in contact with each other and integrated. Therefore, the epitaxial layer EPS has a shape extending in the Y direction in the cross section along the Y direction (see FIG. 4), and does not have a rhombic shape.

The epitaxial layers EPD and EPS in the memory cell region 1A and the epitaxial layer EP1 in the nMIS region 1B are formed of, for example, SiP (silicon phosphide) or SiC (silicon carbide), and the epitaxial layer EP2 in the pMIS region 1C is formed of, for example, SiGe (silicon germanium).

The epitaxial layers EPD and EPS in the memory cell region 1A are semiconductor layers into which n-type impurities (for example, P (phosphorus) or As (arsenic)) are introduced, and each of the epitaxial layers EPD and EPS configures a diffusion region D1. The epitaxial layer EP1 in the nMIS region 1B is a semiconductor layer into which n-type impurities (for example, P (phosphorus) or As (arsenic)) are introduced, and configures a diffusion region D2 of the n-type transistor QN. The epitaxial layer EP2 in the pMIS region 1C is a semiconductor layer into which p-type impurities (for example, B (boron)) is introduced, and configures a diffusion region D3 of the p-type transistor QP.

As shown in FIG. 2 and FIG. 3, the lower portions of the side surfaces of the fins FA, FB, and FC are surrounded by the element isolation regions EI formed on the upper surface of the semiconductor substrate SB. That is, the fins are separated from each other by the element isolation regions EI. In the fin FA, a p-type well PW1, which is a p-type semiconductor region, is formed from the upper surface of the fin FA to the lower portion of the fin FA. Similarly, in the fin FB, a p-type well PW2, which is a p-type semiconductor region, is formed from the upper surface of the fin FB to the lower portion of the fin FB. In the fin FC, an n-type well NW, which is an n-type semiconductor region, is formed from the upper surface of the fin FC to the lower portion of the fin FC.

The control gate electrode CG is formed on the upper surface and the side surface of the fin FA via the gate dielectric film GF, and the memory gate electrode MG is formed in an region adjacent to the control gate electrode CG via the insulating film C1 in the long direction (X direction) of the fin FA. An insulating film C1 is interposed between the control gate electrode CG and the memory gate electrode MG, and the control gate electrode CG and the memory gate electrode MG are electrically isolated by the insulating film C1. That is, the control gate electrode CG and the memory gate electrode MG are insulated from each other. An insulating film C1 is interposed between the memory gate electrodes MG and the upper surface and side surfaces of the fins FA. That is, the memory gate electrodes MG are formed on the upper surface and the side surfaces of the fins FA via the insulating film C1. The insulating film C1 is continuously formed so as to cover the side surface and the bottom surface of the memory gate electrode MG. Therefore, the insulating film C1 has an L-shaped cross-sectional shape.

Note that an ONO film (insulating film C1) including a charge storage portion needs to be formed under the memory gate electrode MG, but the insulating film separating the control gate electrode CG and the memory gate electrode MG need not be an ONO film. Therefore, only an insulating film formed of, for example, a silicon oxide film may be formed between the control gate electrode CG and the memory gate electrode MG.

The gate dielectric film GF is a thermal oxide film (silicon oxide film) formed by thermally oxidizing the upper surface and side surfaces of the fins FA, which are protruding portions of the semiconductor substrate SB made of silicon, and the thickness of the silicon oxide film is, for example, 2 nm. The insulating film C1 is formed of a silicon oxide film X1 formed of a thermal oxide film (silicon oxide film) having a thickness of 4 nm formed by thermally oxidizing the upper surface and side surfaces of the fins FA, which are protruding portions of the semiconductor substrate SB made of silicon, a silicon nitride film NF formed on the silicon oxide film X1, and a silicon oxide film X2 formed on the silicon nitride film NF. The silicon nitride film NF is a charge storage portion (charge storage layer) of the memory cell MC. That is, the insulating film C1 is an ONO (Oxide Nitride Oxide) film. The silicon nitride film has a thickness of 7 nm, for example, and the silicon oxide film X2 has a thickness of 9 nm, for example.

That is, the insulating film C1 has a stacked structure formed of a silicon oxide film X1, a silicon nitride film NF, and a silicon oxide film X2 stacked in this order from the upper surface side of the fins FA and the side surfaces of the control gate electrodes CG. The thickness of the insulating film C1 is, for example, 20 nm, which is larger than the thickness of the gate dielectric films GF under the control gate electrodes CG. The silicon oxide film X2 may be formed of a silicon oxynitride film.

As shown in the memory cell region 1A, the control gate electrodes CG extend in the short direction (Y direction) of the fin FA via the gate dielectric film GF, along the upper surface and the side surface of the fin FA, and the upper surface of the element isolation region EI. Similarly, in the short direction of the fin FA, the memory gate electrodes MG extend along the upper surface and the side surface of the fin FA, and the upper surface of the element isolation regions EI via the insulating film C1. Silicide layers S2 are formed on the upper surface of each of the control gate electrodes CG and the memory gate electrodes MG.

The side surfaces of the pattern including the control gate electrode CG, the memory gate electrode MG, the gate dielectric film GF, the insulating film C1, and the silicide layers S2 are covered with sidewall spacers SW. The sidewall spacer SW has, for example, a stacked structure of a silicon nitride film and a silicon oxide film. The epitaxial layers EPD and EPS cover the pattern including the control gate electrode CG and the surface of the fin FA exposed from the sidewall spacer SW.

As shown in FIG. 3, a pair of source/drain regions are formed in the fin FA so as to sandwich the fin FA under the pattern including the control gate electrode CG. In other words, in the fin FA including the surface of the fin FA, a pair of source region and drain region is formed so as to sandwich the control gate electrode CG and the memory gate electrode MG in the X direction. Each of the source region and the drain region has an extension region EX1 which is an n− type semiconductor region and a diffusion region D1 which is an n+ type semiconductor region. The diffusion region D1 has a higher impurity density and a deeper depth than the extension region EX1. In each of the source region and the drain region, the extension region EX1 and the diffusion region D1 are in contact with each other, and the extension region EX1 is located on the upper surface of the fins FA under the pattern, that is, on the channel region side.

As described above, by forming the source/drain regions having the structure including the extension region EX1 having a low impurity concentration and the diffusion region D1 having a high impurity concentration, that is, the LDD (Lightly Doped Drain) structure, the short-channel characteristics of the transistor having the source/drain regions can be improved. The source region corresponds to the source region MS shown in FIG. 1, and the drain region corresponds to the drain region MD shown in FIG. 1. The extension region EX1 may be formed deeper than the diffusion region D1. The source region configuring the memory cell MC does not need to have the extension region EX1.

An interlayer insulating film IL1 formed of, for example, a silicon oxide film is formed on the fins FA and the element isolation regions EI via an insulating film IF9 formed of, for example, a silicon nitride film. An interlayer insulating film IL2 formed of, for example, a silicon oxide film is formed over the upper surface of each of the interlayer insulating film IL1, the control gate electrode CG, the memory gate electrode MG, the sidewall spacer SW, and the silicide layer S2. The upper surface of the interlayer insulating film IL1 is flattened in substantially the same plane as the upper surface of each of the insulating film C1, the sidewall spacer SW, and the silicide layer S2.

A plurality of wirings M1 are formed on the interlayer insulating film IL2, and the wirings M1 are electrically connected to the source regions and the drain regions of the memory cells MC via plugs PG provided in contact holes CH penetrating the interlayer insulating films IL2 and IL1. Silicide layers S1 are interposed between the plugs PG and the epitaxial layers EPD, and between the plugs PG and the epitaxial layers EPS. The silicide layer S1 is, for example, a NiPt silicide layer.

The upper surface and the side surfaces of each of the epitaxial layers EPD and EPS are covered with silicide layers S1. The silicide layer S1 has a function of reducing a connection resistance between the plug PG, which is a connection portion formed of a metal film mainly containing, for example, tungsten (W), and a drain region in the epitaxial layer EPD made of a semiconductor, and between the plug PG and a source region in the epitaxial layer EPS made of a semiconductor.

Here, the case where each of the contact hole CH and the plug PG has a round shape in plan view is described, but the shape of the contact hole CH and the plug PG in plan view may be a rectangular shape or the like. The contact holes CH and the plugs PG may have widths larger than those of the epitaxial layers EPD, EP1, and EP2 in the short direction (Y direction) of the fins.

The memory cell MC has a control gate electrode CG, a memory gate electrode MG, a drain region, and a source region. The control gate electrode CG and the source/drain regions configure a control transistor, the memory gate electrode MG and the source/drain regions configure a memory transistor, and the memory cell MC is configured by the control transistor and the memory transistor. That is, the control transistor and the memory transistor share the source/drain region. The distance between the drain region and the source region in the gate length direction (X direction) of the control gate electrode CG and the memory gate electrode MG corresponds to the channel length of the memory cell MC.

Memory cells MC sharing a set of the control gate electrode CG and the memory gate electrode MG are formed on the fins FA arranged in the Y direction. A plurality of memory cells MC including different control gate electrodes CG and memory gate electrodes MG are arranged side by side in the X direction on one fin FA.

In the nMIS region 1B, gate electrodes G1 are formed on the upper surface and side surfaces of the fins FB via insulating films HK as gate dielectric films. The insulating film HK continuously covers the bottom surface and the side surface of the gate electrode G1. The insulating film HK is an insulating film having a dielectric constant (relative dielectric constant) higher than that of silicon nitride, i.e., a so-called High-k film (high dielectric constant film). The gate electrode G1 is formed of a metal film MF1 covering the surface of the insulating film HK, and a metal film MF2 formed on the insulating film HK via the metal film MF1. Both side surfaces of the metal film MF2 are covered with the metal film MF1. The metal film MF1 is made of TiAl (titanium aluminum), for example, and the metal film MF2 is made of Al (aluminum), for example. A silicon oxide film may be formed as a part of the gate dielectric film between the fin FB and the insulating film HK, but this silicon oxide film is not shown here.

In the short direction (Y direction) of the fin FB, the gate electrode G1 continuously extends along each of the upper surface and the side surface of the fin FB, and the upper surface of the element isolation region EI via the insulating film HK. The side surfaces of the gate electrode G1 are covered with the sidewall spacers SW.

Each of the source regions and the drain regions provided in the fins FB on the side of the gate electrode G1 so as to sandwich the gate electrodes G1 in the X direction has an extension region EX2 which is an n− type semiconductor region and a diffusion region D2 which is an n+ type semiconductor region, and has an LDD-structure. The diffusion regions D2 are formed in the fins FB and in the epitaxial layers EP1 formed on the side of the gate electrodes G1 via the sidewall spacers SW. The extension regions EX2 are formed from the upper surface and side surfaces of the fins FB to the inside of the fins FB. The source region corresponds to the source region LS1 shown in FIG. 1, and the drain region corresponds to the drain region LD1 shown in FIG. 1.

In the nMIS region 1B, the insulating film IF9, the interlayer insulating films IL1, and IL2 are formed in this order over the fins FB and the element isolation regions EI in the same manner as in the memory cell region 1A. However, an insulating film IF10 is formed between the interlayer insulating film IL1 and the interlayer insulating film IL2 so as to cover the upper surfaces of the gate electrodes G1. The upper surface of the interlayer insulating film IL1 is planarized together with the upper surfaces of the gate electrodes G1, the insulating films HK, and the sidewall spacers SW.

Wirings M1 are formed on the interlayer insulating film IL2, and the wirings M1 are electrically connected to the source regions and the drain regions via plugs PG provided in contact holes CH penetrating the interlayer insulating films IL1 and IL2. A silicide layer S1 is interposed between the plug PG and the epitaxial layer EP1. The silicide layer S1 is, for example, a NiPt silicide layer.

The upper surface and side surfaces of the epitaxial layer EP1 are covered with the silicide layer S1. The silicide layers S1 have a function of reducing connection resistances between the plugs PG, which are connection portions made of a metal film mainly containing, for example, tungsten (W), and source/drain regions in the epitaxial layers EP1 made of semiconductors.

The n-type transistor QN has the gate electrode G1, the drain region, and the source region. The distance between the drain region and the source region in the gate length direction (X direction) of the gate electrode G1 corresponds to the channel length of the n-type transistor QN.

In the pMIS region 1C, gate electrodes G2 are formed on the upper surface and the side surfaces of the fins FC via insulating films HK as gate dielectric films. The insulating film HK continuously covers the bottom surface and the side surface of the gate electrode G2. The insulating film HK is an insulating film having a dielectric constant (relative dielectric constant) higher than that of silicon nitride, i.e., a so-called High-k film (high dielectric constant film). The gate electrode G2 is formed of a metal film MF3 covering the surface of the insulating film HK, and a metal film MF4 formed on the insulating film HK via the metal film MF3. Both side surfaces of the metal film MF4 are covered with the metal film MF3. The metal film MF3 is made of TiAl (titanium aluminum), for example, and the metal film MF4 is made of Al (aluminum), for example. A silicon oxide film may be formed as a part of the gate dielectric film between the fin FC and the insulating film HK, but this silicon oxide film is not shown here.

In the short direction (Y direction) of the fin FC, the gate electrode G2 continuously extends along each of the upper surface and the side surface of the fin FC, and the upper surface of the element isolation region EI via the insulating film HK. The side surfaces of the gate electrode G2 are covered with the sidewall spacers SW.

Each of the source regions and the drain regions provided in the fins FC on the side of the gate electrode G2 so as to sandwich the gate electrodes G2 in the X direction has an extension region EX3 which is a p− type semiconductor region and a diffusion region D3 which is a p+ type semiconductor region, and has an LDD-structure. The diffusion regions D3 are formed in the fins FC and in the epitaxial layers EP2 formed on the side of the gate electrodes G2 via the sidewall spacers SW. The extension regions EX3 are formed from the upper surface and side surfaces of the fins FC to the inside of the fins FC. The source region corresponds to the source region LS2 shown in FIG. 1, and the drain region corresponds to the drain region LD2 shown in FIG. 1.

In the pMIS region 1C, the insulating film IF9, the interlayer insulating film IL1, the insulating film IF10, and the interlayer insulating film IL2 are formed in this order over the fins FC and the element isolation regions EI similarly to the nMIS region 1B. The upper surface of the interlayer insulating film IL1 is planarized together with the upper surfaces of the gate electrodes G2, the insulating films HK, and the sidewall spacers SW.

Wirings M1 are formed on the interlayer insulating film IL2, and the wirings M1 are electrically connected to the source regions and the drain regions via plugs PG provided in contact holes CH penetrating the interlayer insulating films IL1 and IL2. A silicide layer S1 is interposed between the plug PG and the epitaxial layer EP2. The silicide layer S1 is, for example, a NiPt silicide layer.

The upper surface and side surfaces of the epitaxial layer EP2 are covered with the silicide layer S1. The silicide layers S1 have a function of reducing connection resistances between the plugs PG, which are connection portions made of a metal film mainly containing, for example, tungsten (W), and source/drain regions in the epitaxial layers EP2 made of semiconductors.

The p-type transistor QP has the gate electrode G2, the drain region, and the source region. The distance between the drain region and the source region in the gate length direction (X direction) of the gate electrode G2 corresponds to the channel length of the p-type transistor QP.

Here, as one of the main features of the semiconductor device according to the present embodiment, the height of the upper surface of the fin FA in which the diffusion region D1 configuring the drain region is formed, is lower than the height of the upper surface of the fin FA in which the diffusion region D1 configuring the source region is formed. In other words, the upper surface of the fin FA in contact with the epitaxial layer EPS is higher than the upper surface of the fin FA in contact with the epitaxial layer EPD. The upper surface of the fin FA in contact with the epitaxial layer EPS is higher than either the upper surface of the fin FB in contact with the epitaxial layer EP1 or the upper surface of the fin FC in contact with the epitaxial layer EP2. The upper surface of the fin FA in contact with the epitaxial layer EPD is lower than the upper surface of the fin FA under the control gate electrode CG, the memory gate electrode MG, and the sidewall spacer SW in the memory cell region 1A by, for example, 20 nm to 50 nm.

Therefore, a step is formed between the upper surface of the fin FA under the sidewall spacer SW adjacent to the control gate electrode CG and the upper surface of the fin FA in contact with the epitaxial layer EPD. In the present application, the height of the upper surface of the fin and the height of the fin refer to the distance from the upper surface of the element isolation region EI to the upper surface (uppermost end) of the fin FA in the direction (vertical direction, height direction) perpendicular to the upper surface of the semiconductor substrate SB under the element isolation region EI, that is, the upper surface of the semiconductor substrate SB excluding the surfaces of the fins FA to FC.

The upper surface of the fin FA in contact with the epitaxial layer EPD, the upper surface of the fin FB in contact with the epitaxial layer EP1, and the upper surface of the fin FC in contact with the epitaxial layer EP2 are lower than any of the upper surface of the fin FA under the control gate electrode CG and the memory gate electrode MG, the upper surface of the fin FB under the gate electrode G1, and the upper surface of the fin FC under the gate electrode G2.

Therefore, the upper surface of the epitaxial layer EPS is higher than the upper surface of each of the epitaxial layers EPD, EP1, and EP2. The upper surface of each of the epitaxial layers EPD, EPS, EP1, and EP2 is higher than the interface the gate dielectric film GF and the fin FA, and the interface between the insulating film C1 and the fin FA.

In FIG. 4, four cross sections including fins and epitaxial layers are shown side by side along the Y direction. That is, FIG. 4 shows a cross section including the epitaxial layer EPD covering the fin FA in which the drain region is formed, a cross section including the epitaxial layer EPS covering the plurality of fins FA in which the source regions are formed, a cross section including the epitaxial layer EP1 covering the fin FB in which the drain region is formed, and a cross section including the epitaxial layer EP2 covering the fin FC in which the drain region is formed, in order from the left. The cross section including the epitaxial layer EP1 covering the fin FB in which the source region is formed, has the same structure as the structure shown in the nMIS region 1B in FIG. 4, and the cross section including the epitaxial layer EP2 covering the fin FC in which the source region is formed, has the same structure as the structure shown in the pMIS region 1C in FIG. 4.

As shown in FIG. 4, the height of the upper surface of the fin FA in the portion where the source region is formed, is higher than the height of any upper surface of the fin FA in the portion where the drain region is formed, of the fin FB in which the source region or the drain region is formed, and of the fin FC in which the source region or the drain region is formed. The height of the upper surface of the epitaxial layer EPS is higher than the height of the upper surface of any of the epitaxial layers EPD, EP1, and EP2.

The distance (shortest distance) L2 from the side surface of the fin FA at the end portion in the Y direction to the outermost end portion (terminal end portion) of the epitaxial layer EPS in the Y direction among the plurality of fins FA in contact with the same epitaxial layer EPS, is larger than the distance (shortest distance) L1 from the side surface of the fin FA in the Y direction to the outermost end of the epitaxial layer EPD. The distance L2 is larger than either the distance (shortest distance) L3 from the side surface of the fin FB in the Y direction to the outermost end portion of the epitaxial layer EP1, or the distance (shortest distance) L4 from the side surface of the fin FC in the Y direction to the outermost end portion of the epitaxial layer EP2. That is, in the Y direction, the width (distance L2) of the epitaxial layer EPS between the adjacent fins FA is larger than any of the width (distance L1) of the epitaxial layer EPD between the adjacent fins FA, the width (distance L3) of the epitaxial layer EP1 between the adjacent fins FB, and the width (distance L4) of the epitaxial layer EP2 between the adjacent fins FC.

Here, the interval between the fins FA adjacent to each other in the short direction (Y direction) of the fins FA in the memory cell region 1A is larger than the interval between the fins FB adjacent to each other in the nMIS region 1B and the interval between the fins FC adjacent to each other in the pMIS region 1C in the short direction (Y direction) of the fins. However, these intervals may be the same in each of the memory cell region 1A, the nMIS region 1B and the pMIS region 1C. The distance between the fins FA adjacent to each other in the Y direction is, for example, 80 nm to 120 nm.

Since the distance L1 is less than ½ of the distance between the fins FA adjacent to each other in the Y direction, the epitaxial layers EPD in contact with the two fins FA adjacent to each other in the Y direction are separated from each other. Similarly, since the distance L3 is less than ½ of the distance between the fins FB adjacent to each other in the Y direction, the epitaxial layers EP1 in contact with the two fins FB adjacent to each other in the Y direction are separated from each other. Since the distance L4 is less than ½ of the distance between the fins FC adjacent to each other in the Y direction, the epitaxial layers EP2 in contact with the two fins FC adjacent to each other in the Y direction are separated from each other.

On the other hand, since the distance L2 is ½ or more of the distance between the fins FA adjacent to each other in the Y direction, the epitaxial layers EPS which are in contact with the two fins FA adjacent to each other in the Y direction are in contact with each other and are integrated with each other. Therefore, one epitaxial layer EPS covering the fin FA in the portion where the source region of the memory cell MC (see FIG. 3) is formed, covers a plurality of fins FA arranged in the Y direction. Since a high concentration diffusion region D1 (see FIG. 3) is formed in the epitaxial layer EPS, the source regions of the plurality of fins FA are electrically connected to each other via the epitaxial layer EPS. Although FIG. 2 and FIG. 4 show an epitaxial layer EPS covering three fins FA, the epitaxial layer EPS may cover more fins FA.

The reason why the epitaxial layer EPS grows larger than the epitaxial layers EPD, EP1, and EP2 in this manner is that the height of the upper surface of the fins FA in the portions where the source regions are formed in the memory cell region 1A, among the fins serving as the base of the epitaxial growth, is relatively high than that of the epitaxial layers EPD, EP1, and EP2.

In addition, the source potential can be supplied to the source region formed in each of the plurality of fins FA without connecting the same number of plugs as the number of fins covered by the epitaxial layer EPS to the epitaxial layer EPS covering the plurality of fins FA. Therefore, the number of plugs PG arranged directly on one epitaxial layer EPS and electrically connected to the epitaxial layer EPS is smaller than the number of fins FA covered by the epitaxial layer EPS. This can prevent the plugs PG from being densely arranged.

Operation of Nonvolatile Memory

Next, an operation example of the nonvolatile memory will be described with reference to FIG. 41.

FIG. 41 is a table showing an example of a condition for applying a voltage to each portion of the selected memory cell at the time of "write", "erase" and "read". The table of FIG. 41 shows a voltage Vmg applied to the memory gate electrode MG of the memory cell MC (selected memory cell) shown in FIG. 3, a voltage Vs applied to the source region MS (see FIG. 1), a voltage Vcg applied to the control gate electrode CG, a voltage Vd applied to the drain region MD (see FIG. 1), and a voltage Vb applied to the p-type well PW1 at the time of "write", "erase", and "read", respectively. Note that the table shown in FIG. 41 is a suitable example of the voltage application condition, and is not limited to this, and can be variously changed as necessary. Further, in the present embodiment, injection of electrons into the silicon nitride film NF, which is the charge storage portion of the memory transistor, is defined as "write", and injection of holes into the silicon nitride film NF is defined as "erase".

As a write method, a so-called SSI (Source Side Injection) method, which is a write method in which write is performed by hot electron injection by source side injection (hot electron injection write method), can be used. For example, write is performed by applying a voltage as shown in the column of "write" in FIG. 41 to each portion of the selected memory cell in which write is performed, and injecting electrons into the silicon nitride film NF of the insulating film C1 of the selected memory cell.

At this time, hot electrons are generated in the channel region (between the source/drain regions) under between the two gate electrodes (the memory gate electrode MG and the control gate electrode CG), and hot electrons are injected into the silicon nitride film NF, which is the charge storage portion in the insulating film C1 under the memory gate electrode MG. The injected hot electrons are trapped by the trap level in the silicon nitride film NF of the insulating film C1, and as a result, the threshold voltage of the memory transistor rises. That is, the memory transistor is in the write state.

As an erase method, a so-called BTBT method, an erase method (hot hole injection erase method) for performing erase by hot hole injection by BTBT (Band-To-Band Tunneling) can be used. That is, erase is performed by injecting holes generated by BTBT (band-to-band tunneling phenomenon) into the charge storage portion (silicon nitride film NF in the insulating film C1). For example, a voltage as shown in the column of "erase" in FIG. 41 is applied to the respective portions of the selected memory cell to be erased, holes are generated by BTBT phenomena, and holes are injected into the silicon nitride film NF of the insulating film C1 of the selected memory cell by electric field acceleration, thereby lowering the threshold voltage of the memory transistor. That is, the memory transistor is in the erase state.

At the time of read, for example, a voltage as shown in the column of "read" in FIG. 41 is applied to each portion of the selected memory cell to be read. By setting the voltage Vmg applied to the memory gate electrode MG at the time of read to a value between the threshold voltage of the memory transistor in the write state and the threshold voltage of the memory transistor in the erase state, it is possible to discriminate between the write state and the erase state.

Effect of Semiconductor Device

Figure 42:
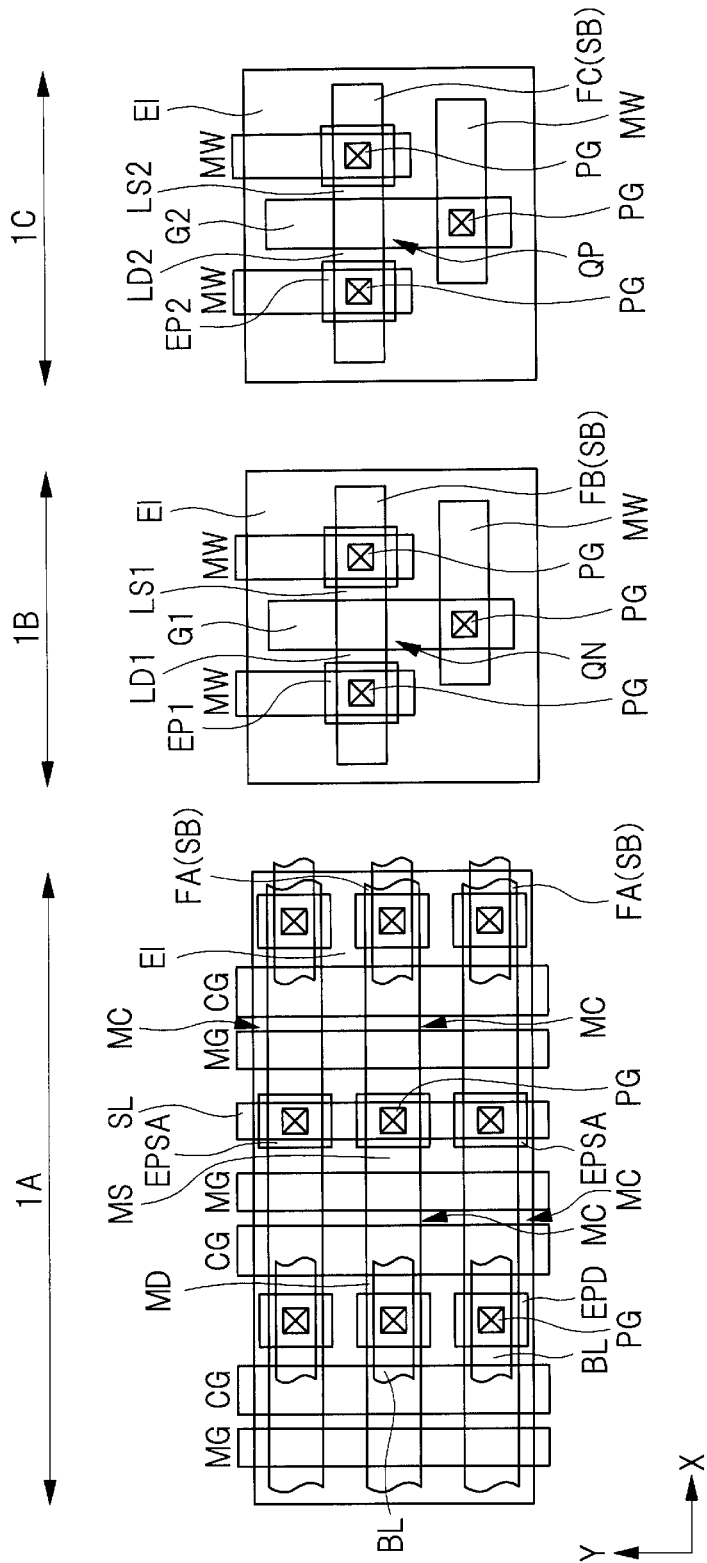
FIG. 42 is a plan view showing a semiconductor device according to a compared example.

Hereinafter, with reference to FIG. 42, it will be described the effect of the semiconductor device of the present embodiment. FIG. 42 is a plan view showing the semiconductor device according to the compared example. FIG. 42 shows planar layouts of the memory cell region 1A, the nMIS region 1B and the pMIS region 1C, respectively, similarly to FIG. 1.

The semiconductor device shown in FIG. 42 differs from the semiconductor device of the present embodiment in that the epitaxial layer EPSA is formed independently for each fin FA similarly to the epitaxial layer EPD, and the source line SL, which is a wiring that electrically connects each of the plurality of epitaxial layers EPSA arranged in the Y direction, extends in the Y direction. That is, the epitaxial layer EPSA covering the fin FA in the portion where the source region MS configuring the memory cell MC in the memory cell region 1A is formed, is separated from the epitaxial layer EPSA covering the other fin FA adjacent to the fin FA in the Y direction. A plurality of source lines SL extending in the Y direction are arranged in the X direction above the memory cell array. That is, the source line SL is formed in a stripe shape.

In the MONOS memory formed of a fin-type transistor, since the width of the fin serving as the active region in the short direction is small, the contact resistance increases when the plug is directly connected to the fin. Therefore, it is conceivable to raise a fin in a portion where the source/drain regions are formed by using an epitaxial growth method, and to connect a plug to the epitaxial layer thus formed.

In such a MONOS memory, when the source lines are commonly connected (the source regions are connected in parallel) by wiring over the element, the line capacitance between the source lines increases with the miniaturization of the semiconductor device, and an operation delay (RC delay) occurs. That is, as in the compared example shown in FIG. 42, in a structure in which source lines SL connected in parallel to source regions MS formed in a plurality of fins FA arranged in the Y direction are formed and a plurality of source lines SL are arranged in the X direction, since the interval between source lines becomes narrow due to cell size reduction, RC delay due to an increase in line capacitance occurs.

Further, as in the compared example, when the plug (contact plug) is formed directly on each of all the source/drain regions, the space between the plugs is narrowed because the plugs are densely arranged. The degree of difficulty in arranging the plugs at a fine pitch in this manner is high, and a plug formation defect is apt to occur due to a non-opening of a contact hole in which the plugs are embedded, or the like.

As a result, the reliability of the semiconductor device is lowered.

Therefore, in the semiconductor device of the present embodiment, by utilizing the fact that the quantity of epitaxial growth differs depending on the height of the fins, the source lines are made common by the epitaxial layers. That is, as shown in FIG. 3, the height of the fin FA exposed from the element isolation region EI is higher in the portion where the source region is formed than in the portion where the drain region is formed. As a result of such epitaxial growth using the fin FA as a base, the epitaxial layer EPS covering the fin FA having a high height, which is a portion where the source region is formed, grows larger than the epitaxial layer EPD covering the fin FA having a low height, which is a portion where the drain region is formed.

Therefore, as shown in FIG. 1, while the epitaxial layers EPD covering the drain regions MD formed in the plurality of fins FA arranged in the Y direction are separated from each other, the epitaxial layers EPS covering the source regions MS formed in the plurality of fins FA arranged in the Y direction are integrated in contact with each other. That is, the plurality of source regions MS are connected in parallel via the epitaxial layer EPS.

Therefore, it is unnecessary to form a source line for supplying a source potential to each of the source regions MS via the same number of plugs PG as the number of source regions MS on the element of the memory cell, and it is possible to prevent an increase in line capacitance caused by arranging a plurality of source lines in a stripe shape on the upper portion of the memory cell array. Therefore, characteristic degradation due to an increase in line capacitance can be prevented, and the reliability of the semiconductor device can be improved.

Further, since it is not necessary to arrange the plug PG directly on the source region MS, the arrangement of the plug PG connected to the source/drain regions can be made sparse. Therefore, the occurrence of defective plug formation can be prevented, and the reliability of the semiconductor device can be improved.

Manufacturing Process of Semiconductor Device

Hereinafter, with reference to FIG. 5 to FIG. 40, the method of manufacturing the semiconductor device of the present embodiment will be described. FIG. 5 and FIG. 13 to FIG. 40 are cross-sectional views of the semiconductor device of the present embodiment during the manufacturing process. FIG. 6 to FIG. 12 are perspective views of the semiconductor device of the present embodiment during the manufacturing process. In the perspective views of FIG. 6 to FIG. 12, illustration of the wells is omitted.

FIG. 5 to FIG. 13 show memory cell region 1A and logic circuit region 1D arranged in order from the left side to the right side. FIG. 14 to FIG. 40 show the memory cell region 1A, the nMIS region 1B and the pMIS region 1C arranged in order from the left side to the right side. The nMIS region 1B and the pMIS region 1C are regions configuring the logic circuit region 1D.

Figure 5:
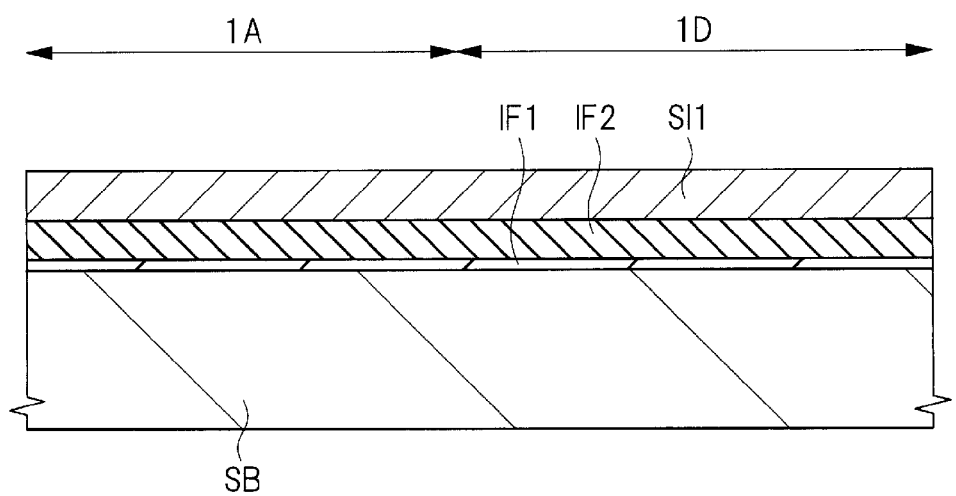
FIG. 5 is a cross-sectional view showing a manufacturing process of the semiconductor device according to the embodiment.

First, as shown in FIG. 5, a semiconductor substrate SB is prepared, and an insulating film IF1, an insulating film IF2, and a semiconductor film SI1 are formed in this order on the upper surface of the semiconductor substrate SB. The semiconductor substrate SB is made of, for example, p-type monocrystalline silicon having a resistivity of about 1 Ωcm to 10 Ωcm. The insulating film IF1 is formed of, for example, a silicon oxide film, and can be formed by, for example, oxidation method or CVD (Chemical Vapor Deposition) method. The thickness of the insulating film IF1 is about 2 nm to 10 nm. The insulating film IF2 is formed of, for example, a silicon nitride film, and has a thickness of about 20 nm to 100 nm. The insulating film IF2 is formed by, for example, CVD method. The semiconductor film SI1 is formed of, for example, a silicon film, and is formed by, for example, CVD method. The thickness of the semiconductor film SI1 is, for example, 20 nm to 200 nm.

Figure 6:
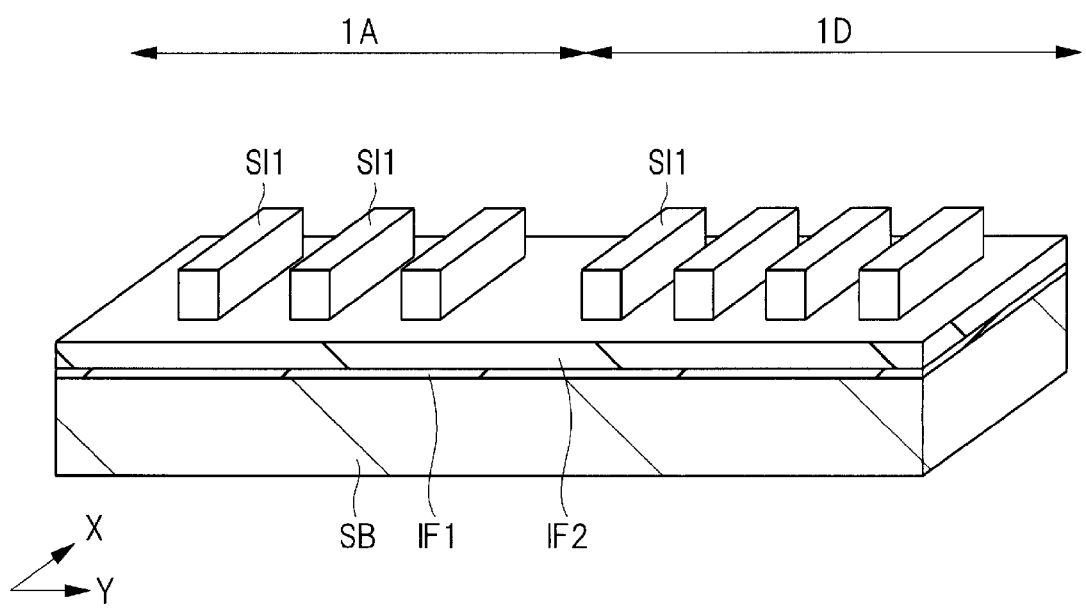
FIG. 6 is a perspective view of the semiconductor device during the manufacturing process following FIG. 5.

Next, as shown in FIG. 6, the semiconductor film SI1 in the memory cell region 1A and the logic circuit region 1D is processed by using a photolithography technique and an etching method. As a result, a plurality of patterns of the semiconductor film SI1 extending in the X direction are formed on the insulating film IF2 side by side in the Y direction.

The width of the pattern in the Y direction in the memory cell region 1A is larger than the width of the pattern in the Y direction of the logic circuit region 1D. In the Y direction, the interval between the patterns arranged in the memory cell region 1A is larger than the interval between the patterns arranged in the logic circuit region 1D. In the subsequent steps, since fins are formed in regions adjacent to the semiconductor film SI1 in the Y direction, by changing widths and intervals of the patterns, intervals between adjacent fins can be adjusted.

Figure 7:
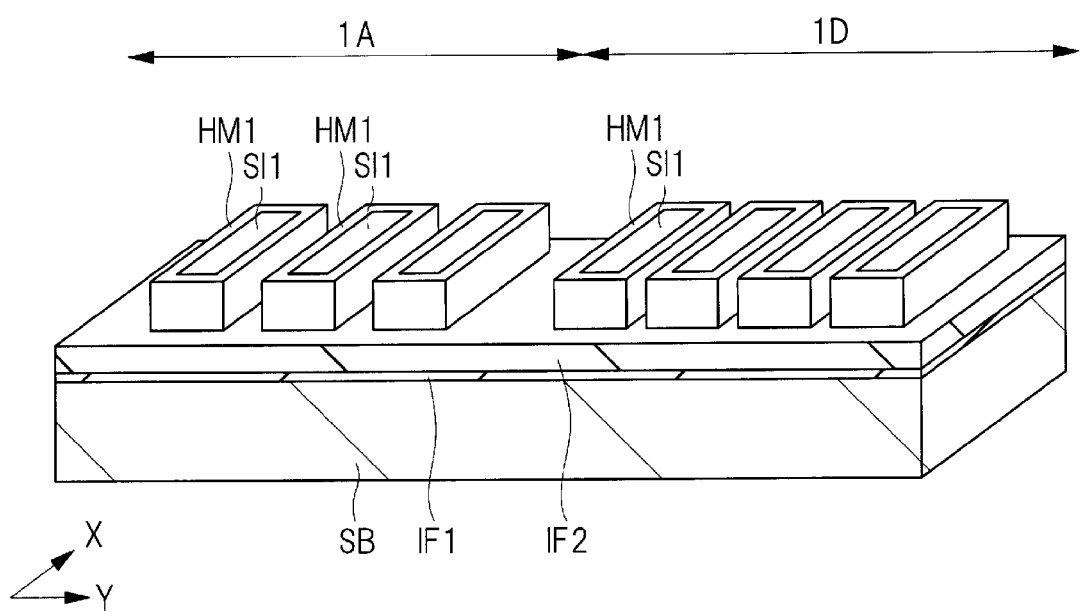
FIG. 7 is a perspective view of the semiconductor device during the manufacturing process following FIG. 6.

Next, as shown in FIG. 7, hard masks HM1 are formed to cover the respective side surfaces of the plurality of semiconductor films SI1. Here, for example, a silicon oxide film having a thickness of 10 nm to 40 nm is formed on the semiconductor substrate SB by CVD method, and then dry etching, which is anisotropic etching, is performed on the silicon oxide film. Thus, by exposing the upper surface of each of the insulating film IF2 and the semiconductor film SI1, the hard masks HM1 formed of the silicon oxide film remaining on the side surfaces of the semiconductor films SI1 are formed. The hard mask HM1 does not completely embed the space between the adjacent semiconductor films SI1. As shown in FIG. 7, the hard masks HM1 are annularly formed so as to surround the respective semiconductor films SI1.

Figure 8:
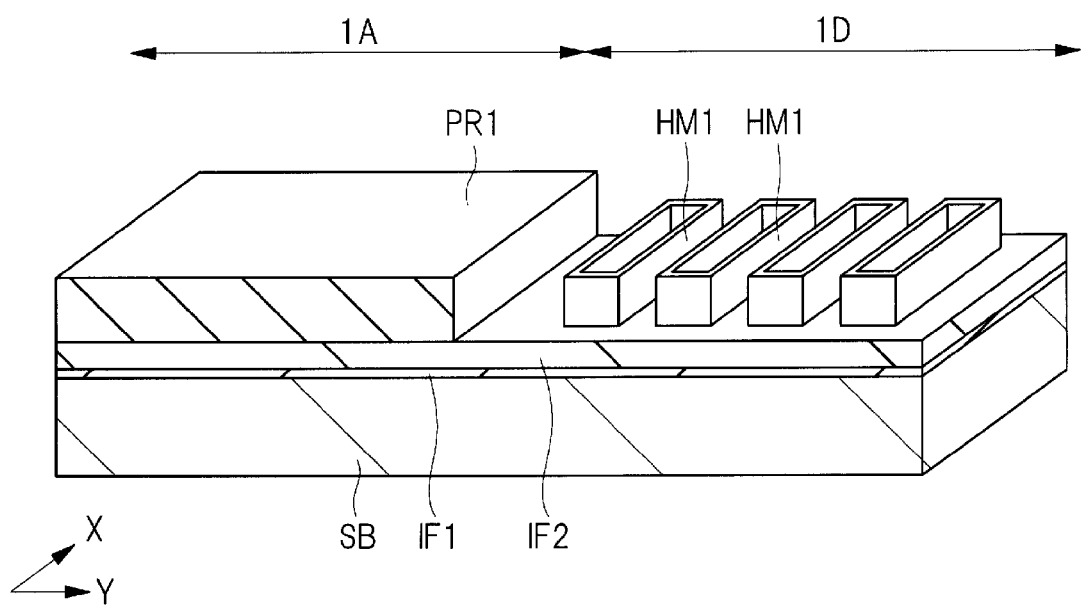
FIG. 8 is a perspective view of the semiconductor device during the manufacturing process following FIG. 7.

Next, as shown in FIG. 8, the semiconductor films SI1 are removed by wet etching. Subsequently, a photoresist film PR1 is formed to cover the hard masks HM1 in the memory cell region 1A and expose the hard masks HM1 in the logic circuit region 1D. Subsequently, wet etching is performed to remove a part of the surface of the hard mask HM1. As a result, the widths of the hard masks HM1 in the logic circuit region 1D are reduced. The width referred to in the present application refers to the length of the pattern and the like in a direction along the upper surface of the semiconductor substrate SB.

The hard masks HM1 are masks used to form fins under the hard masks. Therefore, by providing a difference between the width of the hard mask HM1 in the memory cell region 1A and the width of the hard mask HM1 in the logic circuit region 1D as described above, it is possible to provide a difference between the widths of the fins formed in the memory cell region 1A and the logic circuit region 1D.

Figure 9:
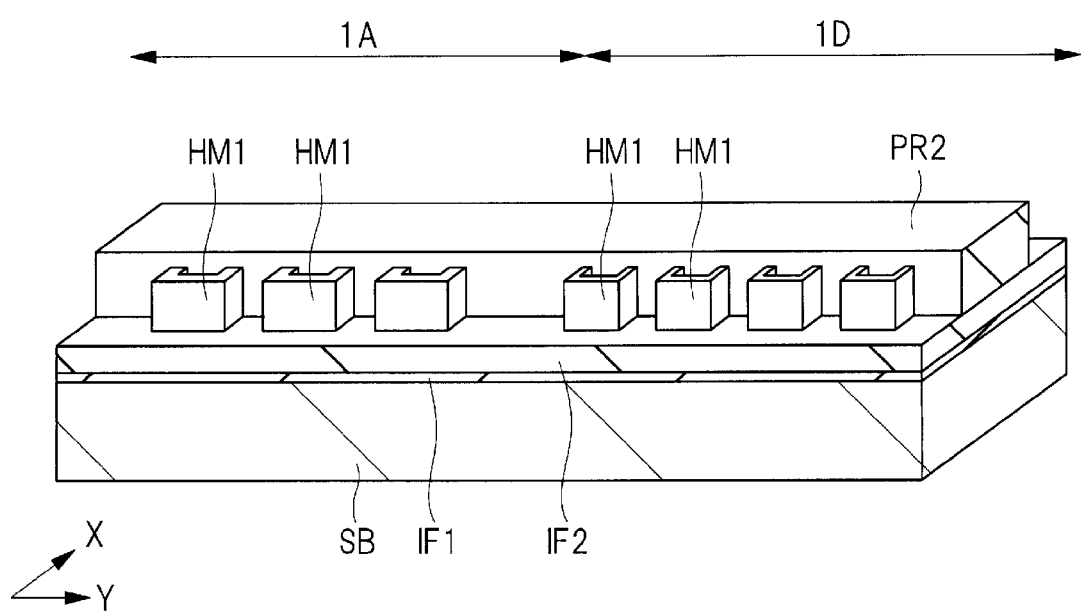
FIG. 9 is a perspective view of the semiconductor device during the manufacturing process following FIG. 8.

Next, as shown in FIG. 9, after removing the photoresist film PR1, a photoresist film PR2 is formed to cover a part of the hard masks HM1 in the memory cell region 1A and the logic circuit region 1D. The photoresist film PR2 is a resist pattern that covers a portion of the hard masks HM1 that extend in the X direction, and expose end portions of the portions that extend in the X direction and portions that extend in the Y direction. That is, both end portions of the hard masks HM1 in the X direction are exposed from the photoresist film PR2.

Figure 10:
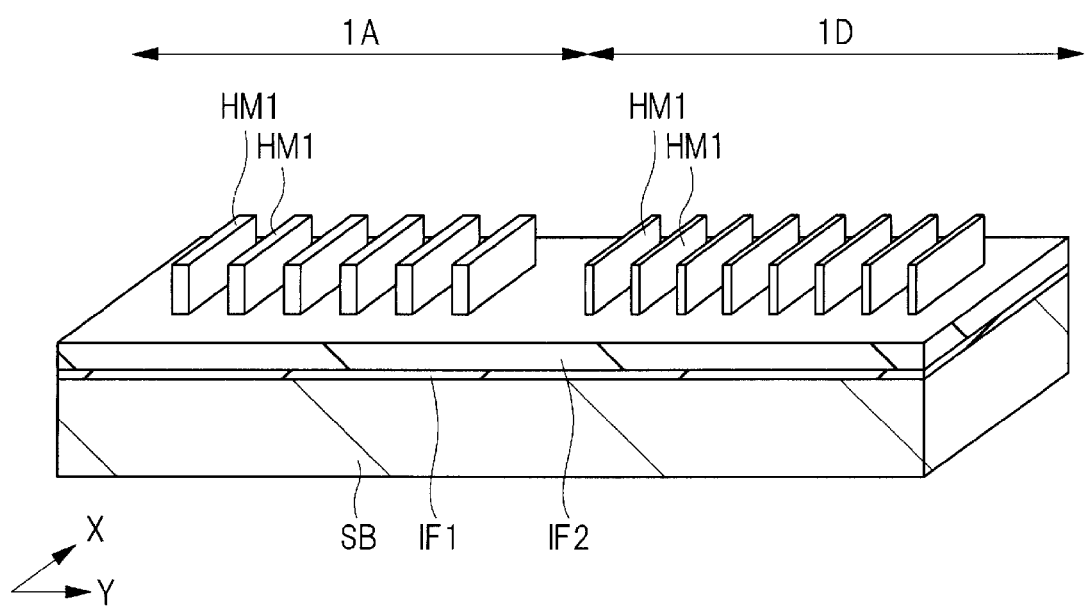
FIG. 10 is a perspective view of the semiconductor device during the manufacturing process following FIG. 9.

Next, as shown in FIG. 10, parts of the hard masks HM1 are removed by etching using the photoresist film PR2 as a mask, and then the photoresist film PR2 is removed. As a result, only the parts of the hard masks HM1 extending in the X direction remain. That is, on the insulating film IF2, a plurality of hard masks HM1, which are patterns extending in the X direction, are arranged side by side in the Y direction.

Figure 11:
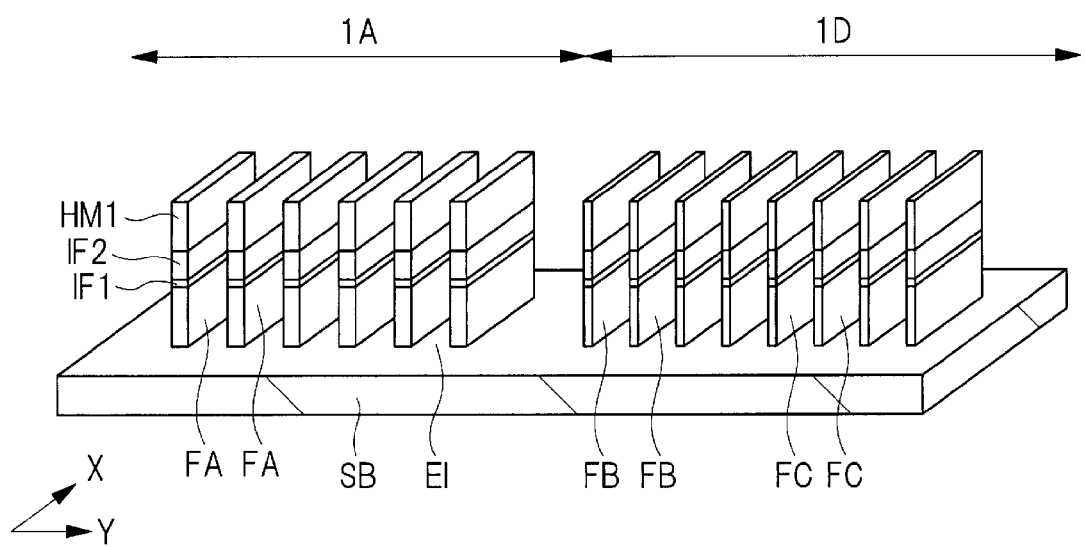
FIG. 11 is a perspective view of the semiconductor device during the manufacturing process following FIG. 10.

Next, as shown in FIG. 11, using the hard masks HM1 as masks, anisotropic dry etching is performed to the insulating films IF1, IF2 and the semiconductor substrate SB. As a result, patterns, which are parts of the semiconductor substrate SB processed into a plate shape (wall shape), i.e., fins FA, FB, and FC, are formed under the hard masks HM1. Here, the fins FA, FB, and FC having a height of 100 nm to 250 nm from the upper surface of the semiconductor substrate SB can be formed by retracting the upper surface of the semiconductor substrate SB in the region exposed from the hard masks HM1 by 100 nm to 250 nm to form trenches. That is, the fins FA, FB, and FC are protruded upward from the bottom surfaces of the trenches formed around the fins FA, FB, and FC, respectively.

Figure 12:
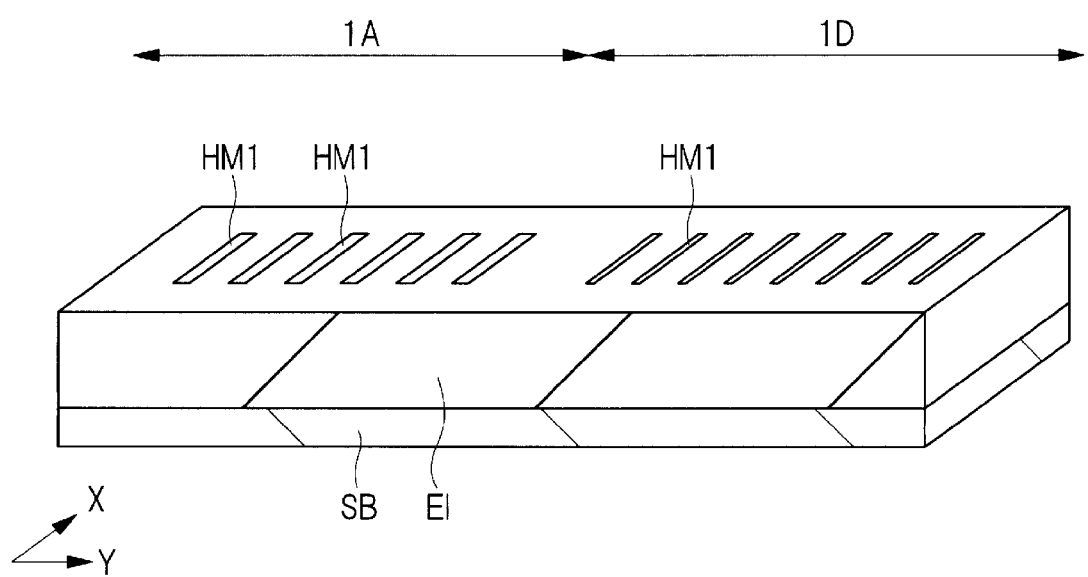
FIG. 12 is a perspective view of the semiconductor device during the manufacturing process following FIG. 11.

Next, as shown in FIG. 12, an insulating film formed of a silicon oxide film or the like is deposited on the semiconductor substrate SB so as to completely embed the fins FA, FB, FC, the insulating films IF1 and IF2. Subsequently, the insulating film is polished by CMP (Chemical Mechanical Polishing) method to expose the upper surface of the insulating film IF2. Thus, an element isolation region EI formed of the insulating film is formed. The hard masks HM1 are removed by the CMP process. Note that the hard masks HM1 may be removed prior to forming the insulating film configuring the element isolation region EI.

Figure 13:
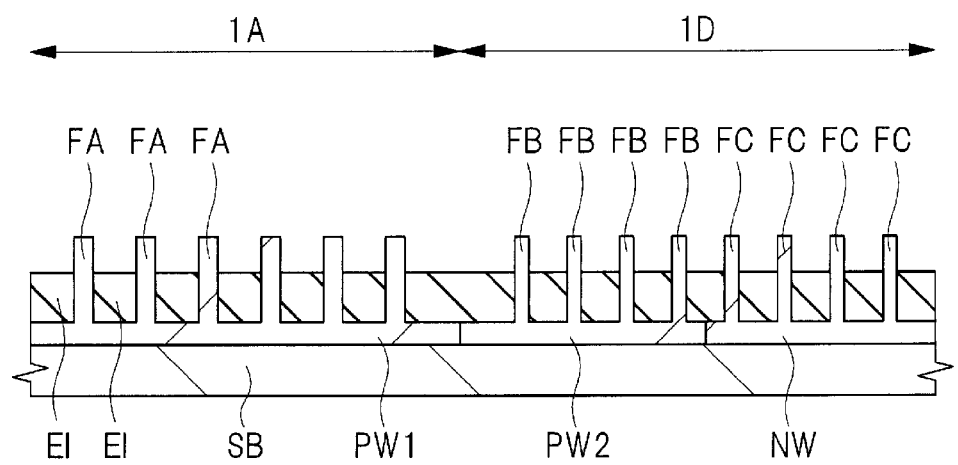
FIG. 13 is a cross-sectional view of the semiconductor device during the manufacturing process following FIG. 12.

Next, as shown in FIG. 13, the insulating films IF1, IF2 are removed. Subsequently, by performing an etching process on the upper surface of the element isolation region EI, the upper surface of the element isolation region EI is retracted (lowered) in the height direction. Thereby, a part of the side surfaces and the upper surface of each of the fins FA, FB and FC are exposed.

Subsequently, a p-type well PW1 is formed in the fin FA in the memory cell region 1A by introducing impurities into the upper surface of the semiconductor substrate SB using ion implantation method, a p-type well PW2 is formed in the fin FB in the logic circuit region 1D, and an n-type well NW is formed in the fin FC in the logic circuit region 1D. The p-type well PW1, PW2 is formed by implanting p-type impurities (for example, B (boron)). The n-type well NW is formed by implanting n-type impurities (for example, P (phosphorus) or As (arsenic)). Each well is formed so as to spread over the whole of each fin and a part of the semiconductor substrate SB below each fin.

Figure 14:
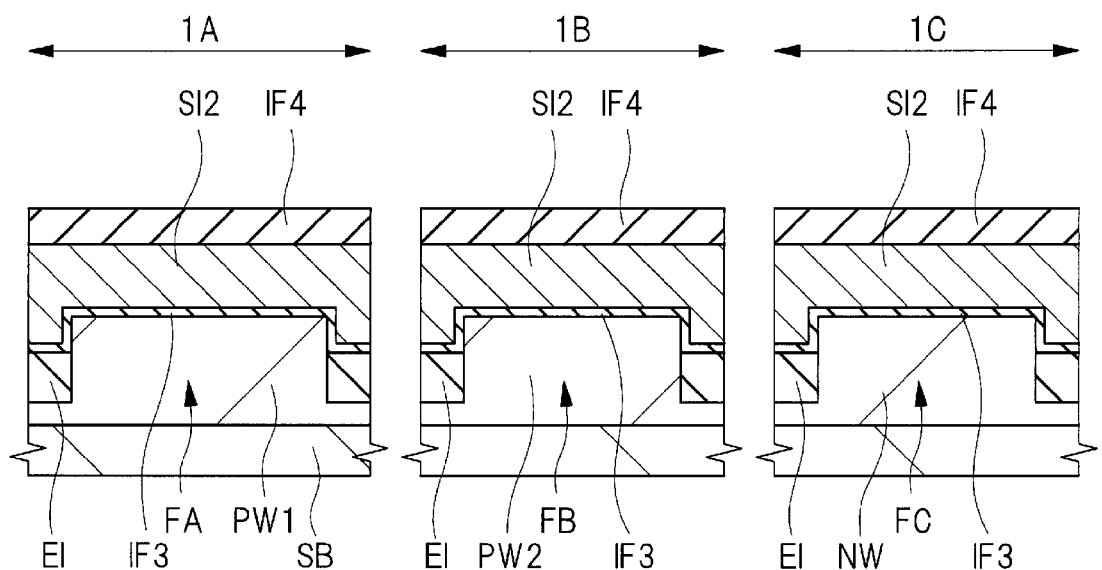
FIG. 14 is a cross-sectional view of the semiconductor device during the manufacturing process following FIG. 13.

Next, as shown in FIG. 14, an insulating film IF3 is formed to cover the upper surface and side surfaces of the fins FA, FB, and FC, respectively. The insulating film IF3 can be formed by, for example, thermal oxidation method, and is formed of, for example, a silicon oxide film having a thickness of about 2 nm. Subsequently, a semiconductor film SI2 having a thickness equal to or greater than the height of each of the fins FA, FB, and FC is deposited on the insulating film IF3 by CVD method or the like, and then the upper surface of the semiconductor film SI2 is flattened by CMP method or the like, thereby forming a semiconductor film SI2 having a flat upper surface. Thereafter, the insulating film IF4 is formed on the semiconductor film SI2 by using, for example, CVD method. The semiconductor film SI2 is formed of, for example, a polysilicon film, and the insulating film IF4 is formed of, for example, a silicon nitride film. Even after the CMP process is performed on the semiconductor film SI2 as described above, the semiconductor film SI2 remains on the upper surfaces of the fins FA, FB, and FC.

Figure 15:
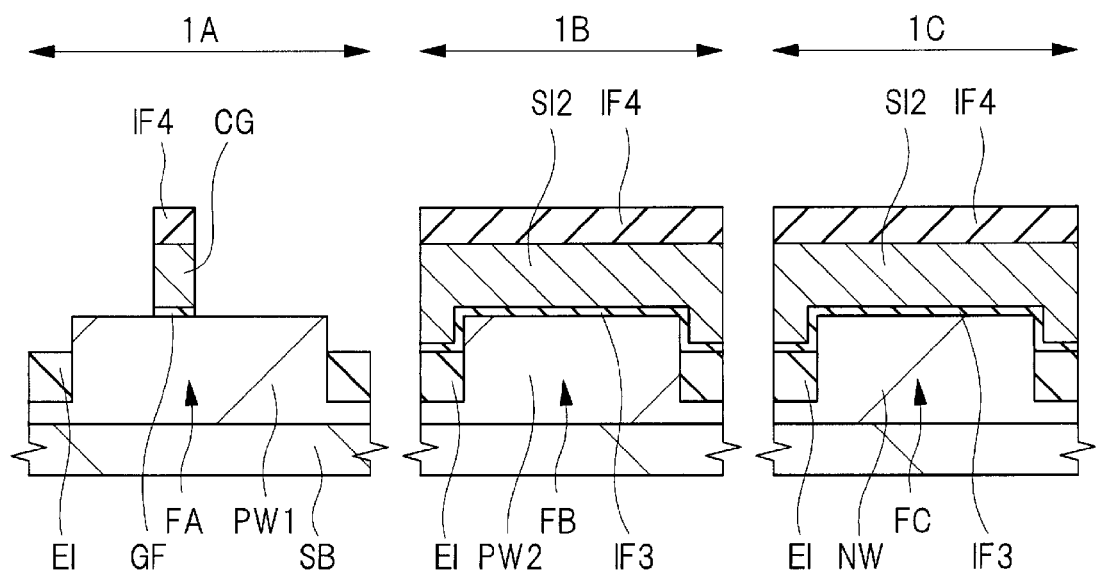
FIG. 15 is a cross-sectional view of the semiconductor device during the manufacturing process following FIG. 14.

Next, as shown in FIG. 15, a photoresist film (not shown) is formed to cover a portion of the fin FA in the memory cell region 1A and the nMIS region 1B and the pMIS region 1C. The photoresist film includes a resist pattern extending in the Y direction so as to cover each of the plurality of fins FA arranged in the Y direction (the depth direction in the drawing) in the memory cell region 1A. In the region next to the resist pattern, the upper surface of the fin FA is exposed from the photoresist film.

Subsequently, by performing etching using the photoresist film as a mask, a part of each of the insulating film IF4 and the semiconductor film SI2 in the memory cell region 1A is removed, thereby exposing the upper surface of the element isolation region EI and the surface of the insulating film IF3 in the memory cell region 1A. That is, part of the upper surface and part of the side surface of the fin FA are exposed from the insulating film IF4 and the semiconductor film SI2. Thereby, the control gate electrode CG formed of the semiconductor film SI2 is formed on the fin FA. Thereby, the gate insulating film GF formed of the insulating film IF3 between the control gate electrode CG and the fin FA is formed.

Here, the case where the insulating film IF3 covering the surface of the fin FA exposed from the control gate electrode CG is removed by the etching and the subsequent cleaning process and the surface of the fin FA is exposed will be described, but the upper surface and side surfaces of the fin FA may remain covered with the insulating film IF3.

Figure 16:
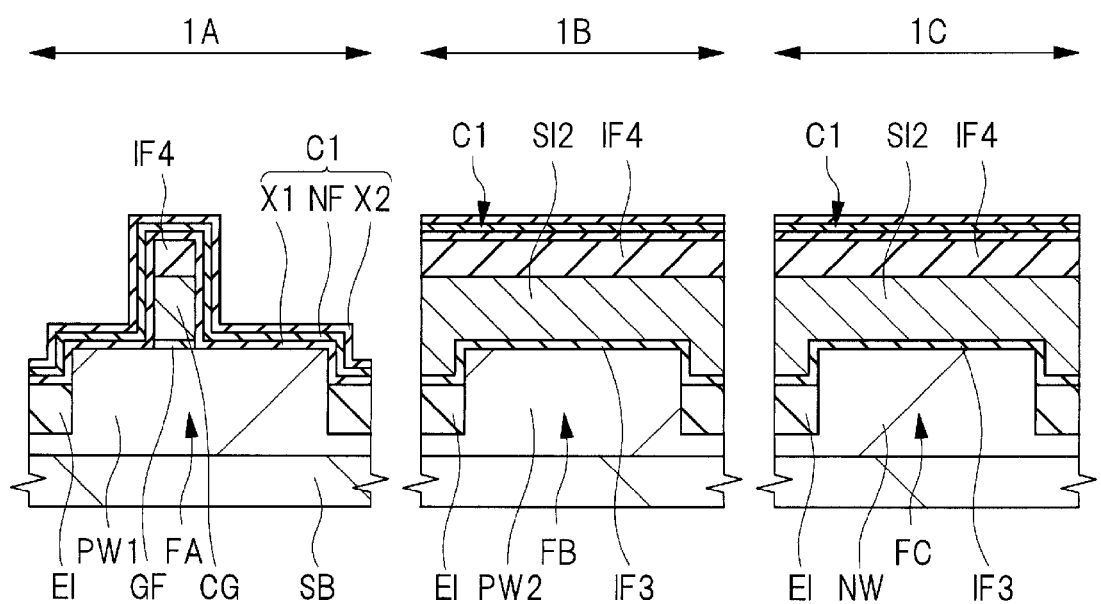
FIG. 16 is a cross-sectional view of the semiconductor device during the manufacturing process following FIG. 15.

Next, as shown in FIG. 16, a silicon oxide film (bottom oxide film) X1, a silicon nitride film NF, and a silicon oxide film (top oxide film) X2 are formed in this order on the semiconductor substrate SB, thereby forming an insulating film C1 having a stacked structure formed of the silicon oxide film X1, the silicon nitride film NF, and the silicon oxide film X2. That is, the insulating film C1 is an ONO film. The silicon oxide film X1 can be formed by oxidation method, CVD method, or the like. The silicon nitride film NF and the silicon oxide film X2 are formed (deposited) by, for example, CVD method.

The insulating film C1 covers the upper surface of the element isolation region EI and the upper surface and side surfaces of the fins FA. The insulating film C1 covers the upper surface and side surfaces of the stacked pattern formed of the control gate electrode CG and the insulating film IF4. Note that the silicon nitride film NF is a film functioning as a charge storage portion (charge storage film) of a memory cell to be formed later, but a high-k film made of HfSiO or the like may be formed instead of the silicon nitride film NF. Also, an AlO (aluminum oxide) film may be formed instead of the silicon oxide film X2.

Figure 17:
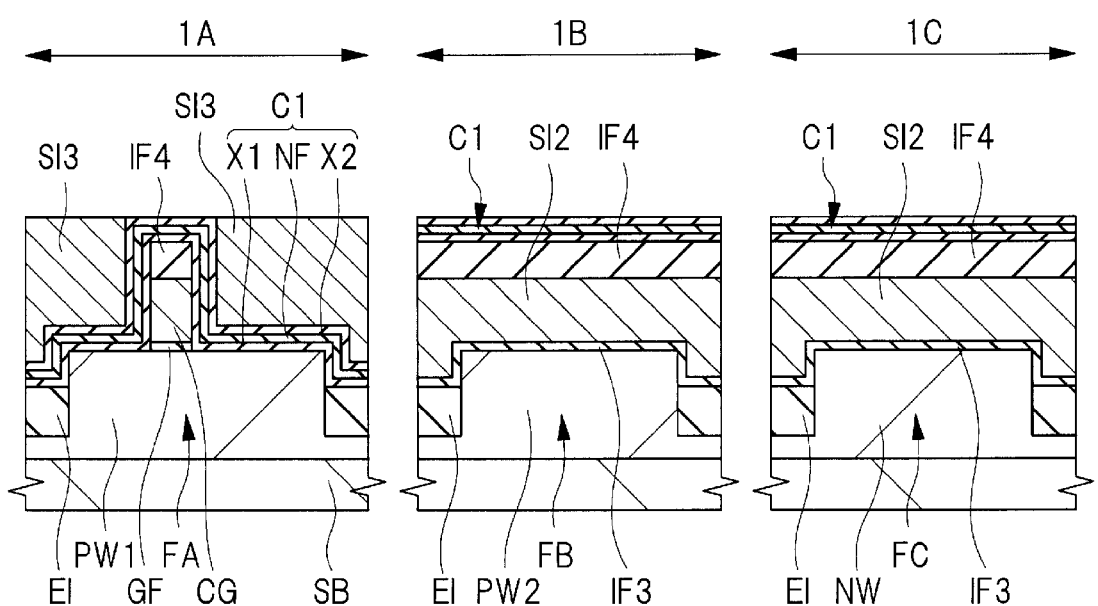
FIG. 17 is a cross-sectional view of the semiconductor device during the manufacturing process following FIG. 16.

Next, as shown in FIG. 17, a semiconductor film SI3 is formed on the semiconductor substrate SB by, for example, CVD method. The semiconductor film SI3 is formed of, for example, a polysilicon film, and has a thickness larger than the height of the stacked structure including the control gate electrode CG and the insulating film IF4. Subsequently, the upper surface of the semiconductor film SI3 is polished by the CMP method to expose the upper surface of the insulating film C1 on the insulating film IF4.

Figure 18:
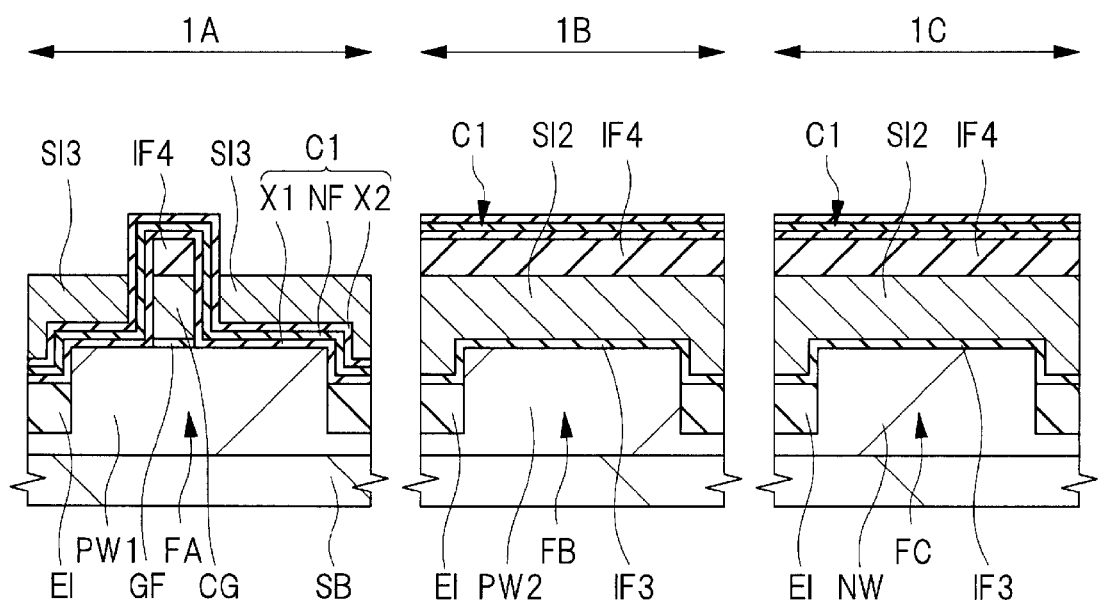
FIG. 18 is a cross-sectional view of the semiconductor device during the manufacturing process following FIG. 17.

Next, as shown in FIG. 18, the upper surface of the semiconductor film S13 is retracted by performing an etchback process. Thereby, the position of the upper surface of the semiconductor film S13 becomes, for example, a height substantially equal to the position of the upper surface of the control gate electrode CG.

Figure 19:
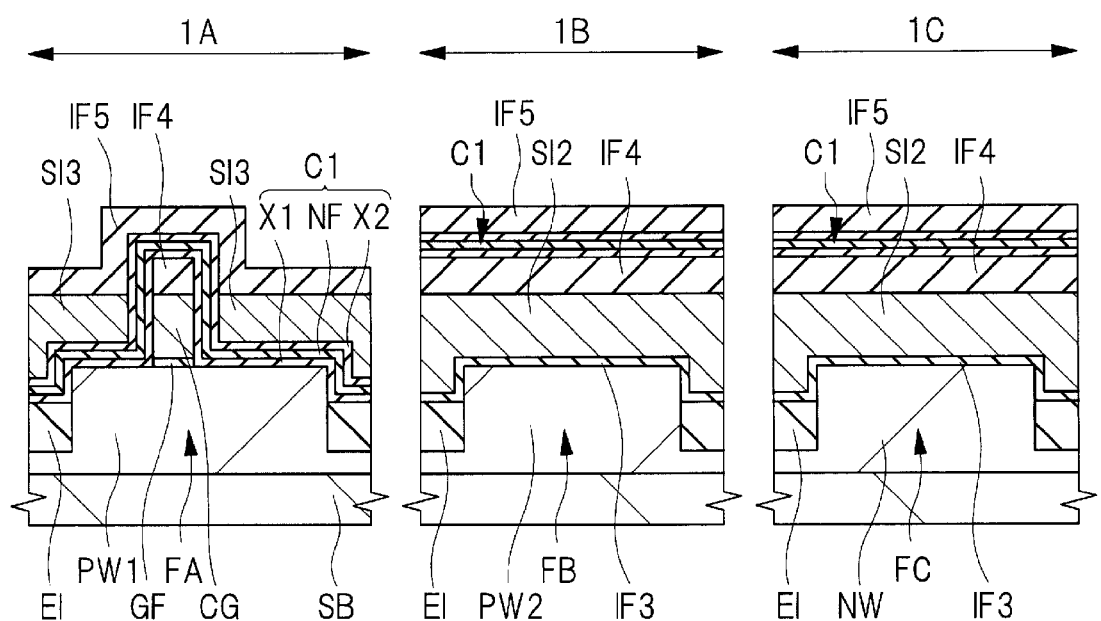
FIG. 19 is a cross-sectional view of the semiconductor device during the manufacturing process following FIG. 18.

Next, as shown in FIG. 19, an insulating film IF5 is formed on the semiconductor substrate SB by, for example, CVD method. The insulating film IF5 is formed of, for example, a silicon nitride film, and covers the side surface and the upper surface of the insulating film IF4 and the upper surface of the semiconductor film S13 via the insulating film C1.

Figure 20:
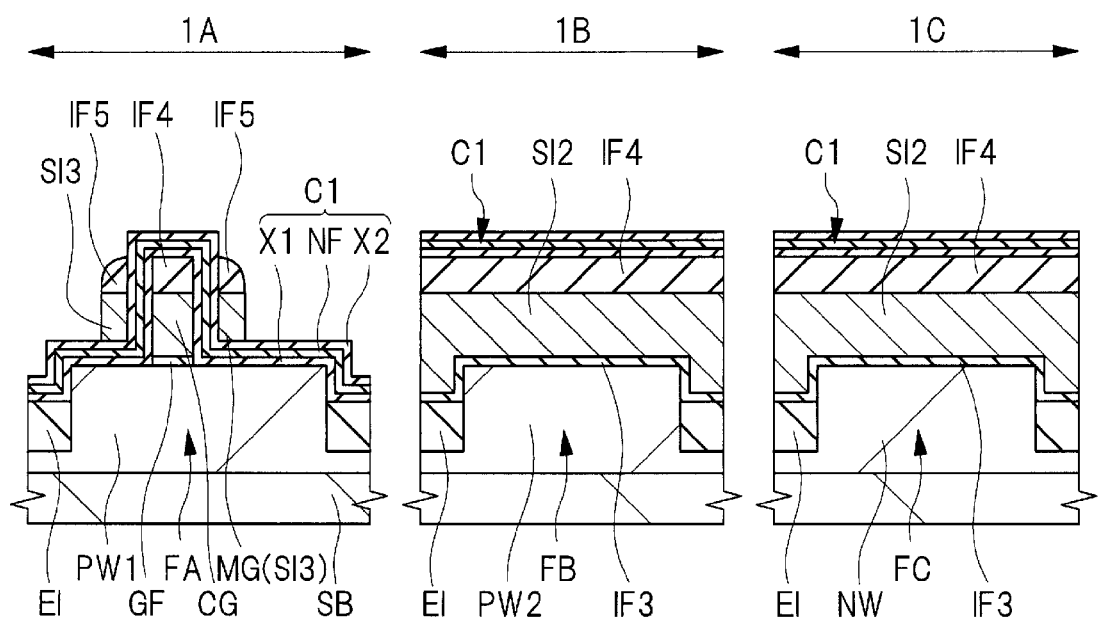
FIG. 20 is a cross-sectional view of the semiconductor device during the manufacturing process following FIG. 19.

Next, as shown in FIG. 20, dry etching is performed to remove part of the insulating film IF5, thereby exposing the upper surface of the insulating film C1 and the upper surface of the semiconductor film S13. That is, the insulating film IF5 remains in a sidewall spacer shape on the side surface of the insulating film IF4 via the insulating film C1. Subsequently, the semiconductor film S13 is processed by etching using the insulating film IF5 as a mask. As a result, the semiconductor film S13 remains in the region adjacent to the side surfaces on both sides of the control gate electrode CG, and the upper surface of the fins FA is exposed from the semiconductor film S13 in the region other than the region adjacent to the side surfaces on both sides of the control gate electrode CG.

The semiconductor film S13 adjacent to one side surface of the control gate electrode CG in the gate length direction (X direction) via the insulating film C1 configures the memory gate electrode MG. The memory gate electrode MG extends in the Y direction so as to straddle the plurality of fins FA along with the control gate electrode CG.

Figure 21:
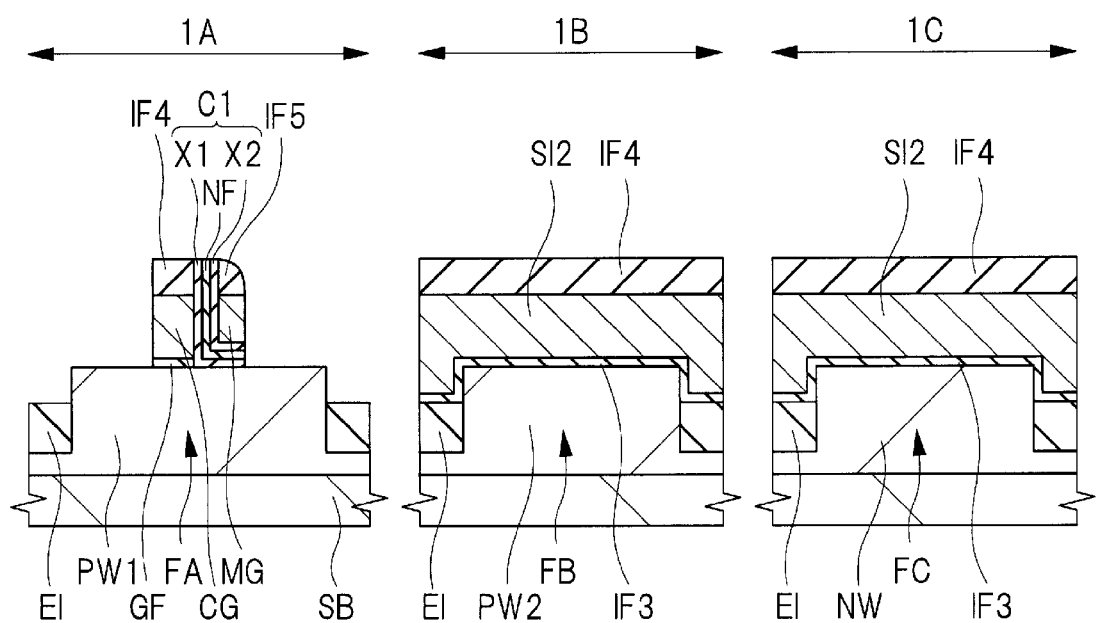
FIG. 21 is a cross-sectional view of the semiconductor device during the manufacturing process following FIG. 20.

Next, as shown in FIG. 21, a resist pattern (not shown) is formed to cover the memory gate electrode MG and the insulating film IF5 on the memory gate electrode MG, and then the insulating film IF5 and the semiconductor film S13 exposed from the resist pattern are removed by etching using the resist pattern as a mask. As a result, the memory gate electrode MG remains on one side surface of the control gate electrode CG via the insulating film C1 in the gate length direction, and the other side surface of the control gate electrode CG is exposed from the semiconductor film S13 in the gate length direction.

Subsequently, the insulating film C1 not covered with the insulating film IF5 and the memory gate electrode MG is removed by etching. As a result, the upper surface of the insulating film IF4, the upper surface of the fin FA, the side surface of the fin FA, and the upper surface of the element isolation region EI are exposed. In addition, the side surface of the insulating film IF4 and the side surface of the control gate electrode CG that are not covered with the memory gate electrode MG are exposed.

Figure 22:
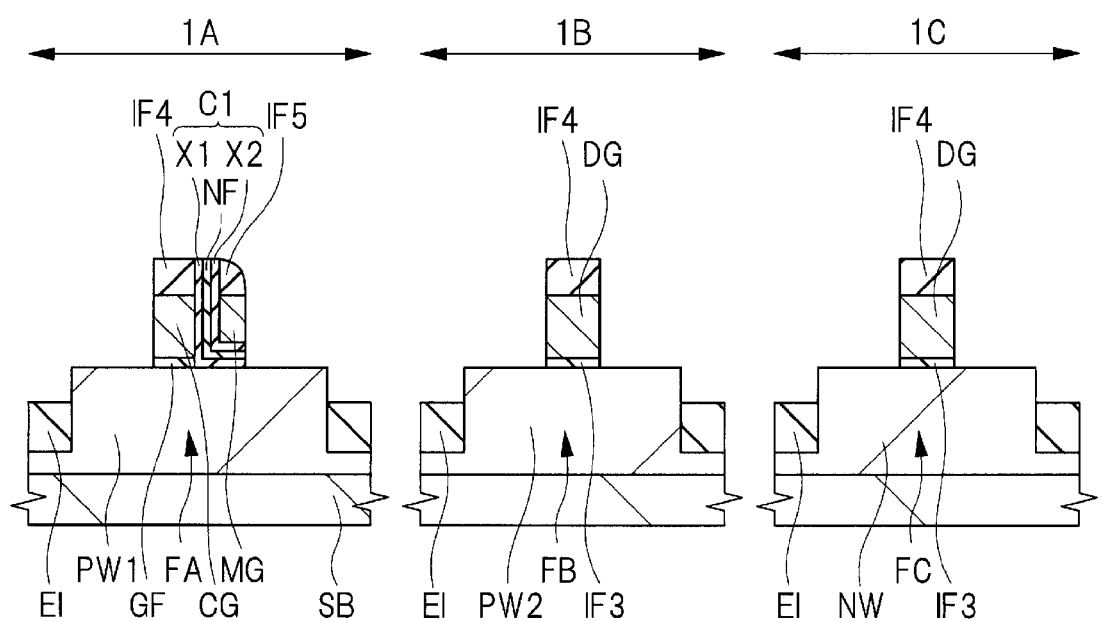
FIG. 22 is a cross-sectional view of the semiconductor device during the manufacturing process following FIG. 21.

Next, as shown in FIG. 22, a photoresist film (not shown) is formed to cover the memory cell region 1A and parts of fins FB and FC in the nMIS region 1B and the pMIS region 1C. The photoresist film includes a resist pattern that extends in the Y direction and covers part of each of the plurality of fins FB arranged in the Y direction (depth direction in the figure), and a resist pattern that extends in the Y direction and covers a part of each of the plurality of fins FC arranged in the Y direction. In the region next to the resist pattern, the upper surface of each of the fins FB and FC is exposed from the photoresist film.

Subsequently, by performing etching using the photoresist film as a mask, a part of each of the insulating film IF4 and the semiconductor film SI2 in the nMIS region 1B and the pMIS region 1C is removed, thereby exposing the upper surface of the element isolation region EI and the surface of the insulating film IF3 in the nMIS region 1B and the pMIS region 1C. That is, part of the upper surface and part of the side surface of each of the fins FB and FC are exposed from the insulating film IF4 and the semiconductor film SI2. As a result, the dummy gate electrodes DG formed of the semiconductor film SI2 are formed on the fins FB and FC via the insulating film IF3 interposed therebetween.

The dummy gate electrode DG is a film which is removed in a subsequent step and replaced with a metal gate electrode, and does not remain in the completed semiconductor device. That is, the dummy gate electrode DG is a pseudo gate electrode. Here, a case where the insulating film IF3 covering the surfaces of the fins FB and FC exposed from the dummy gate electrode DG is removed will be described. Thereafter, although not shown, a silicon oxide film is formed to cover the side surface of the dummy gate electrode DG.

Figure 23:
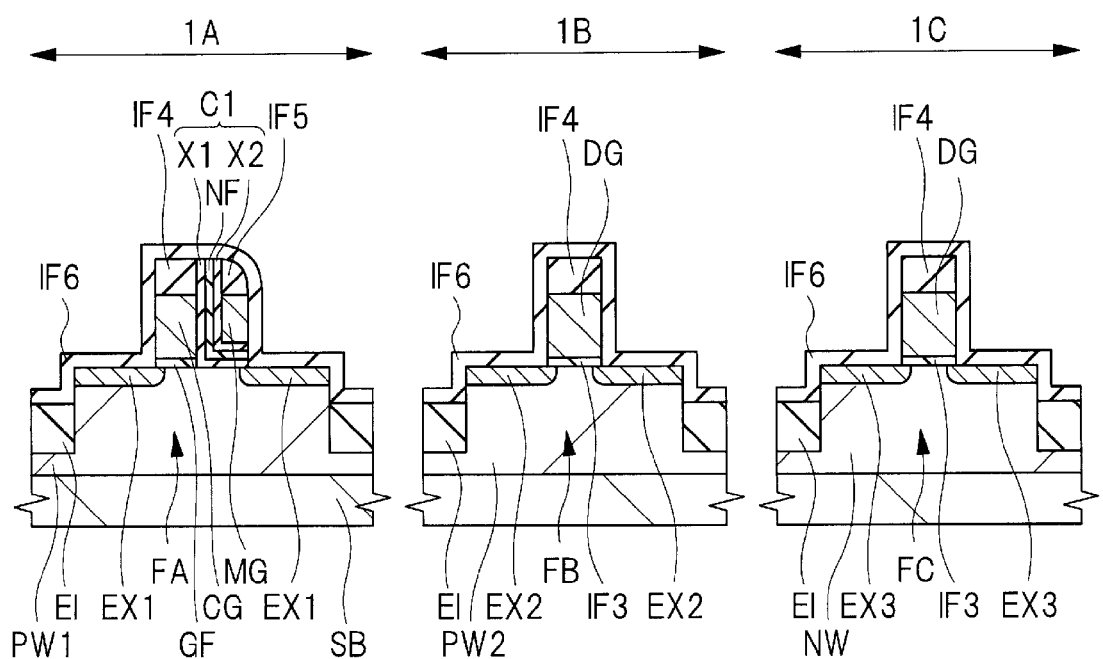
FIG. 23 is a cross-sectional view of the semiconductor device during the manufacturing process following FIG. 22.

Next, as shown in FIG. 23, using the insulating film IF4, IF5, the control gate electrode CG, the memory gate electrode MG, and the dummy gate electrode DG as masks, ions are implanted into the upper surface of each of the fins FA, FB, and FC. As a result, a pair of extension regions EX1, which are n-type semiconductor regions, are formed on the upper surface of the fins FA. A pair of extension regions EX2, which are n-type semiconductor regions, are formed on the upper surface of the fins FB. A pair of extension regions EX3, which are p-type semiconductor regions, are formed on the upper surface of the fins FC.

At least the extension region EX3 is formed in a step different from the step of forming the extension region EX1, EX2. The extension regions EX1, EX2 can be formed by implanting n-type impurities (for example, P (phosphorus) or As (arsenic)). The extension regions EX3 can be formed by implanting p-type impurities (for example, B (boron)). Here, the extension region EX1 is formed in the fin FA on the side of the memory gate electrode MG, but the extension region EX1 may not be formed.

Subsequently, an insulating film IF6 is formed on the semiconductor substrate SB by, for example, CVD method. The insulating film IF6 is formed of, for example, a silicon nitride film. The insulating film IF6 covers the surfaces of the element isolation region EI, the fins FA, FB, and FC, the control gate electrodes CG, the memory gate electrodes MG, the dummy gate electrodes DG, and the insulating films IF4 and IF5.

Figure 24:
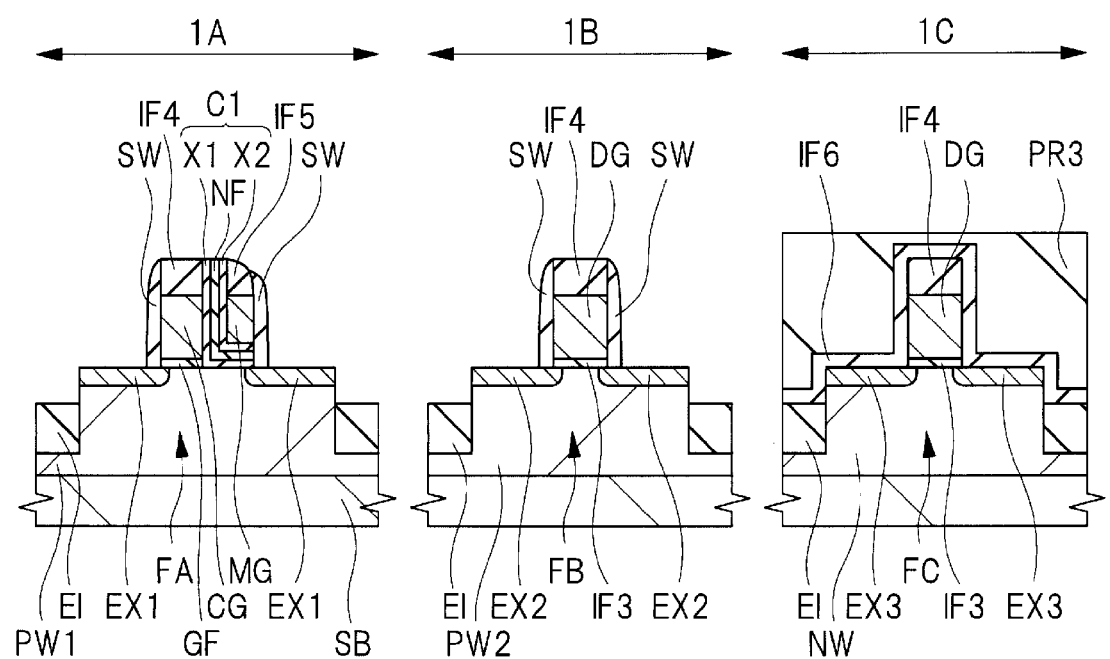
FIG. 24 is a cross-sectional view of the semiconductor device during the manufacturing process following FIG. 23.

Next, as shown in FIG. 24, after forming a photoresist film PR3 that exposes the memory cell region 1A and the nMIS region 1B and covers the pMIS region 1C, dry etching is performed using the photoresist film PR3 as a mask to remove a part of the insulating film IF6 in the memory cell region 1A and the nMIS region 1A, thereby exposing the upper surface of each of the element isolation regions EI, the fins FB, and the insulating film IF4. Sidewall spacers SW formed of the insulating film IF6 are formed on both side surfaces of the patterns including the control gate electrodes CG and the memory gate electrodes MG in the memory cell region 1A. Further, sidewall spacers SW formed of the insulating film IF6 are formed on the side surfaces of the stacked structures formed of the dummy gate electrodes DG in the nMIS region 1B and the insulating films IF4 on the dummy gate electrodes DG.

At this time, sidewall spacers formed of the insulating film IF6 may be formed on the respective side surfaces of the fins FA and FB, but the sidewall spacers formed on the side surfaces of the fins FB are not shown in FIG. 24. Also, in the case where sidewall spacers are formed on the side surfaces of the fins FA and FC in a subsequent step, the illustration of the sidewall spacers is omitted.

Figure 25:
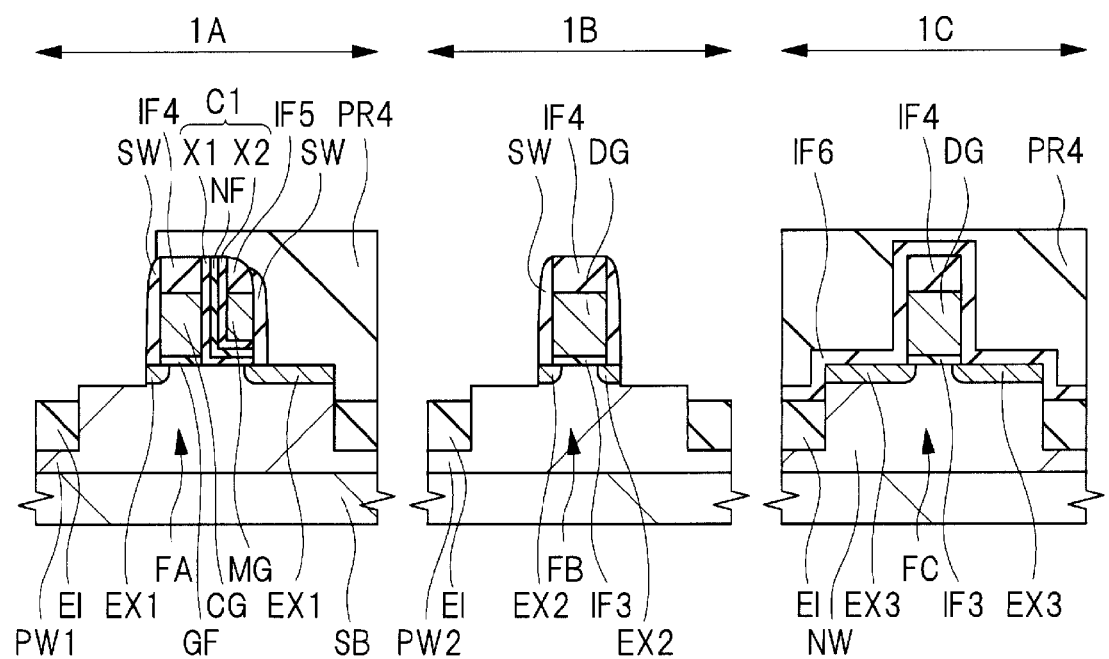
FIG. 25 is a cross-sectional view of the semiconductor device during the manufacturing process following FIG. 24.

Next, as shown in FIG. 25, after removing the photoresist film PR3, a photoresist film PR4 that exposes part of the memory cell region 1A and the nMIS region 1B and covers the pMIS region 1C is formed. The photoresist film PR4 is a resist pattern that covers the surface of the fin FA on the memory gate electrode MG side and exposes the surface of the fin FA on the control gate electrode CG side, among the fins FA on both sides sandwiching the pattern including the control gate electrode CG and the memory gate electrode MG in the X direction in the memory cell region 1A.

Subsequently, dry etching is performed using the photoresist film PR4, the insulating film IF4, and the sidewall spacers SW as masks. As a result, the upper surface of the fins FA exposed from the control gate electrodes CG, the memory gate electrodes MG, the sidewall spacers SW, and the photoresist film PR4 in the memory cell region 1A, and the upper surface of the fins FB exposed from the patterns including the dummy gate electrodes DG and the sidewall spacers SW in the nMIS region 1B are retracted. That is, in the memory cell region 1A, in plan view, the upper surface on the control gate electrode CG side among the upper surface of the fins FA sandwiching the control gate electrode CG and the memory gate electrode MG is retracted to the semiconductor substrate SB side. Here, the upper surface of each of the fins FA and FB is retracted to the semiconductor substrate SB side by, for example, 20 nm to 50 nm.

As a result, the upper surface of the fin FA next to the control gate electrode CG and the upper surface of the fin FB next to the dummy gate electrode DG are retracted to the position that is higher than the upper surface of the element isolation region EI and lower than any of the upper surfaces of the fins FA under the memory gate electrode MG and on the side of the memory gate electrode MG the upper surfaces of the fins FB under the dummy gate electrode DG That is, in the memory cell region 1A, although, among the upper surfaces of the fins FA next to the control gate electrode CG and the memory gate electrode MG, the upper surface of the fin FA on the control gate electrode CG side, that is, the portion where the drain region is formed, is retracted and becomes lower, the upper surface of the fin FA on the side of the memory gate electrode MG, that is, the portion where the source region is formed, is protected and thus is not etched and remains high.

Figure 26:
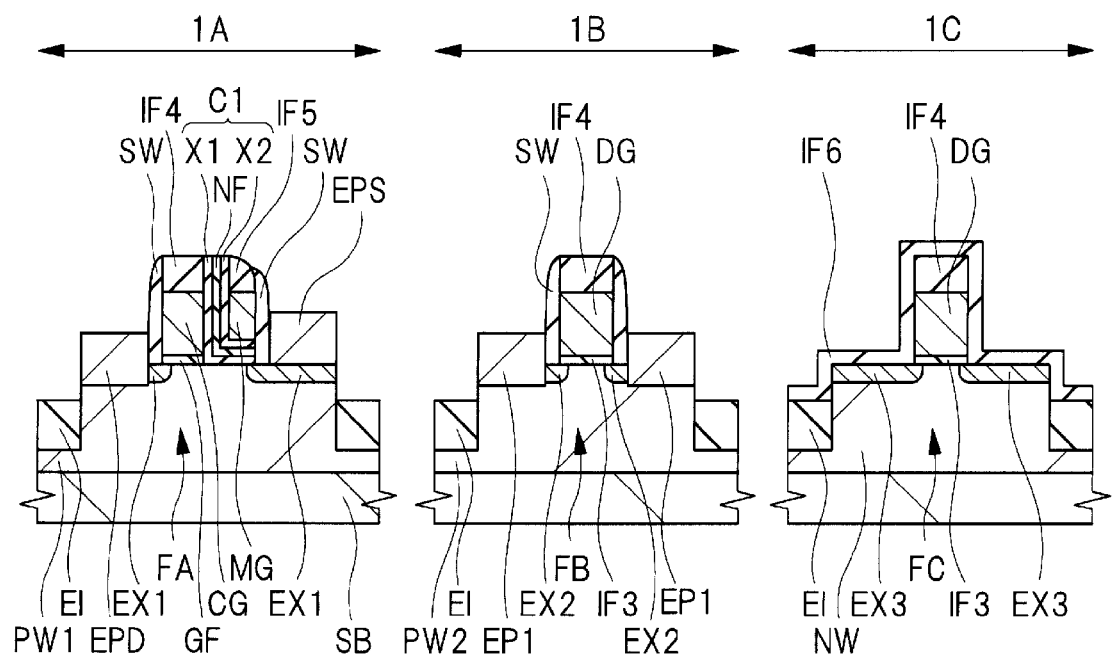
FIG. 26 is a cross-sectional view of the semiconductor device during the manufacturing process following FIG. 25.

Next, as shown in FIG. 26, after removing the photoresist film PR4, epitaxial layers EPD and EPS in the memory cell region 1A and an epitaxial layer EP1 in the nMIS region 1B are formed by epitaxial growth method. That is, in the memory cell region 1A, among the surface (upper surface and side surface) of the fin FA exposed from the control gate electrode CG, the memory gate electrode MG, and the sidewall spacer SW, the epitaxial layer EPD covering the surface of the fin FA on the control gate electrode CG side and the epitaxial layer EPS covering the surface of the fin FA on the memory gate electrode MG side are formed. In the nMIS region 1B, epitaxial layers EP1 are formed to cover the surfaces (upper surface and side surfaces) of the fins FB exposed from the patterns including the dummy gate electrodes DG and the sidewall spacers SW. The epitaxial layers EPD, EPS and EP1 made of, for example, silicon. The epitaxial layers EPD and EPS are in contact with the upper surface and side surfaces of the fin FA, and the epitaxial layer EP1 is in contact with the upper surface and side surfaces of the fin FB. Here, for example, epitaxial layers EPD, EPS and EP1 formed of a SiP (silicon phosphide) film or a SiC (silicon carbide) film may be formed.

As described with reference to FIG. 4, the epitaxial layers EPD and EP1 are semiconductor layers having diamond cross-sectional shapes, and cover the side surfaces of the fins FB in the Y direction. On the other hand, the epitaxial layer EPS is formed by contacting and integrating diamond-shaped semiconductor layers grown from the surfaces of the plurality of fins FA arranged in the Y direction. Therefore, the epitaxial layer EPS has a shape extending in the Y direction in the cross section along the Y direction (see FIG. 4), and does not have a rhombic shape.

The amount of epitaxial growth increases with increasing fin height and decreases with decreasing fin height. That is, the amount of growth in the lateral direction (the direction horizontal to the upper surface of the semiconductor substrate) in the epitaxial growth process varies depending on the height of the fin. Here, epitaxial growth is performed in a state where the upper surface of the fin FA on the control gate electrode CG side is lower than the upper surface of the fin FA on the memory gate electrode MG side, among the fins FA sandwiching the control gate electrode CG and the memory gate electrode MG in plan view. Therefore, the epitaxial layer EPS grows larger in the lateral direction than the epitaxial layers EPD and EP1, since the height of the upper surface of the fin FA beside the memory gate electrode MG is higher than both the upper surface of the fin FA beside the control gate electrode CG and the upper surface of the fin FB beside the dummy gate electrode DG in the nMIS region 1B. Therefore, the epitaxial layers EPD covering each of the fins FA adjacent in the Y direction are separated from each other, and the epitaxial layers EP1 covering each of the fins FB adjacent in the Y direction are separated from each other, whereas the epitaxial layers EPS covering each of the fins FA adjacent to each other in the Y direction are in contact with each other and are integrated with each other.

In FIG. 26, the epitaxial layer EP1 does not cover the side surface of the fins FB in the X direction, but the epitaxial layer EP1 may cover the side surface of the fins FB in the X direction. When the side surface of the fins FB in the X direction is covered with a silicon oxide film or the like, it is considered that the side surface of the fins FB is not covered with the epitaxial layers EP1. Similarly, the side surfaces of the fins FA in the X direction in the memory cell region 1A may be covered with epitaxial layers EPD or EPS.

Figure 27:
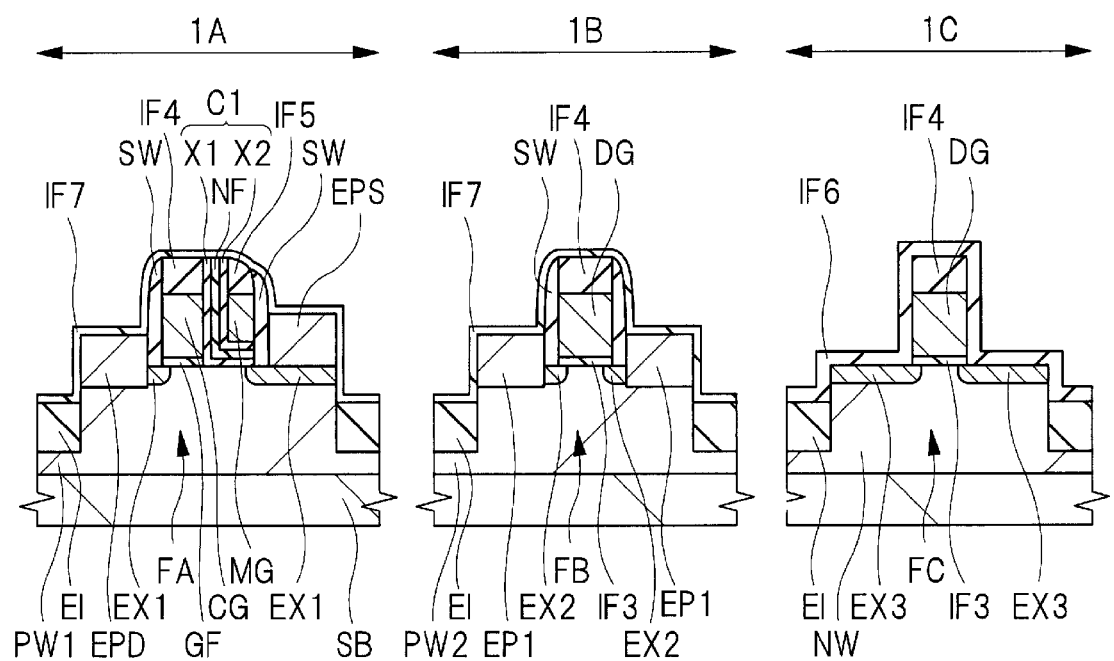
FIG. 27 is a cross-sectional view of the semiconductor device during the manufacturing process following FIG. 26.

Next, as shown in FIG. 27, an insulating film IF7 formed of, for example, a silicon nitride film is formed on the semiconductor substrate SB. The insulating film IF7 can be formed by, for example, CVD method. In the pMIS region 1C, the insulating film IF7 is formed so as to cover the surface of the insulating film IF6, but in FIG. 27, the insulating film IF7 in the pMIS region 1C is omitted because the insulating film IF7 is integrated with the insulating film IF6.

Figure 28:
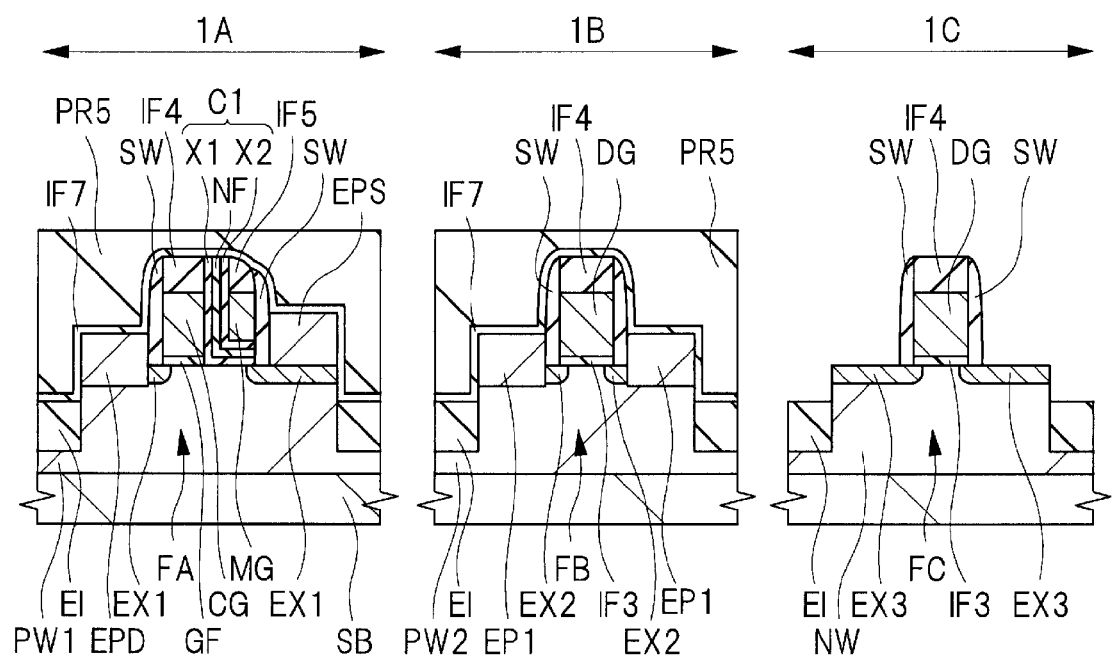
FIG. 28 is a cross-sectional view of the semiconductor device during the manufacturing process following FIG. 27.

Next, as shown in FIG. 28, after forming a photoresist film PR5 that exposes the pMIS region 1C and covers the memory cell region 1A and the nMIS region 1B, dry etching is performed using the photoresist film PR5 as a mask to remove a part of the insulating film IF6 in the pMIS region 1C, thereby exposing the upper surface of each of the element isolation region EI, the fins FC, and the insulating film IF4. Sidewall spacers SW formed of an insulating film IF6 is formed on the side surfaces of stacked structures formed of the dummy gate electrode DG in the pMIS region 1C and the insulating film IF4 on the dummy gate electrode DG.

Figure 29:
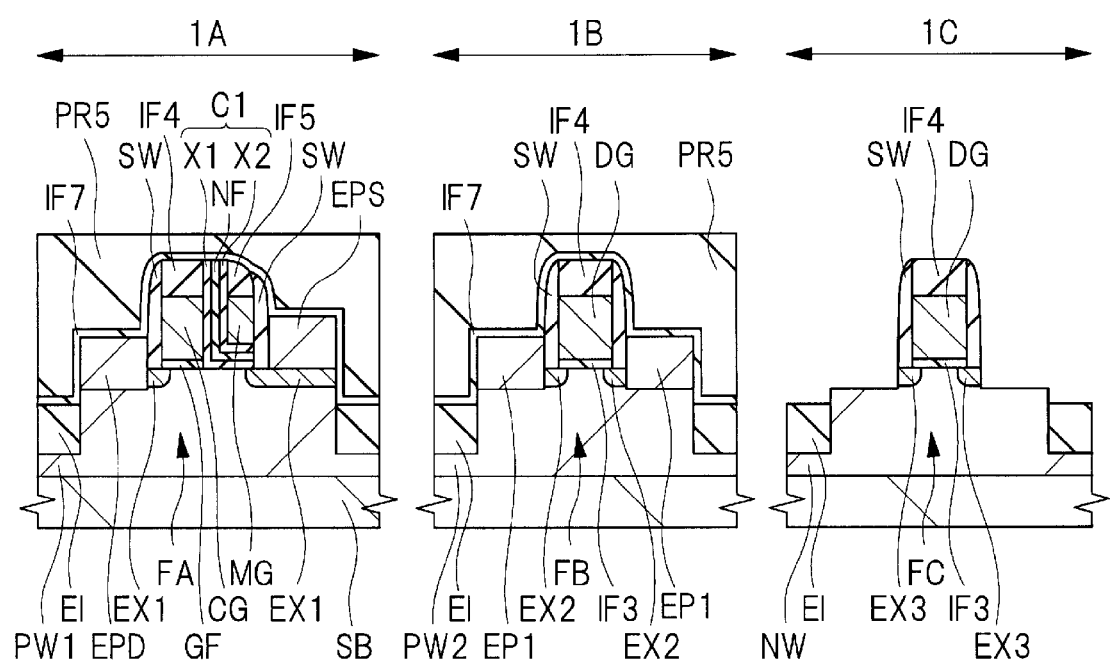
FIG. 29 is a cross-sectional view of the semiconductor device during the manufacturing process following FIG. 28.

Next, as shown in FIG. 29, dry etching is performed using the photoresist film PR5, the insulating film IF4, and the sidewall spacers SW as masks, thereby retracting the upper surface of the fins FC exposed from the patterns including the dummy gate electrodes DG and the sidewall spacers SW in the pMIS region 1C. As a result, the upper surface of the fins FC exposed from the patterns is retracted to the position higher than the upper surface of the element isolation region EI and lower than the upper surface of the fin FC under the dummy gate electrode DG. Here, the upper surface of the fins FC is retracted by, for example, 20 nm to 50 nm. As a result, the upper surface of the fins FC exposed from the patterns becomes lower than the upper surface of the fins FA on the side of the memory gate electrodes MG and in contact with the epitaxial layers EPS.

Figure 30:
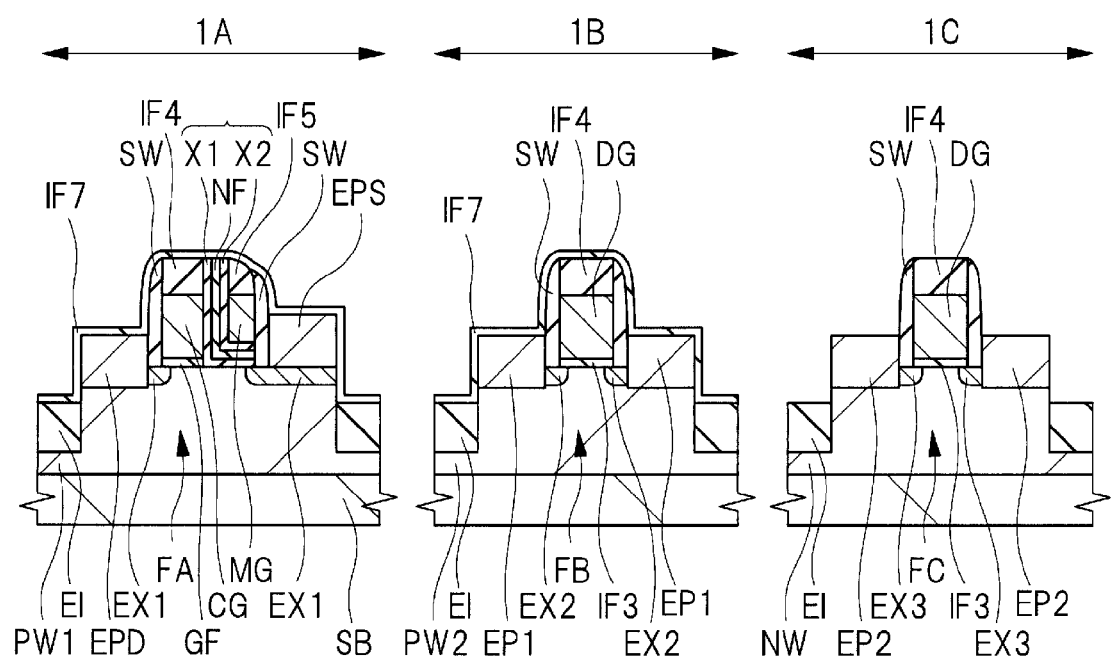
FIG. 30 is a cross-sectional view of the semiconductor device during the manufacturing process following FIG. 29.

Next, as shown in FIG. 30, epitaxial layers EP2 covering the upper surface and side surfaces of the fins FC exposed from the patterns including the dummy gate electrodes DG and the sidewall spacers SW in the pMIS region 1C are formed by epitaxial growth. The epitaxial layers EP2 are made of, for example, SiGe (silicon germanium).

As described with reference to FIG. 4, the epitaxial layer EP2 is a semiconductor layer having a diamond-shaped cross-section, and covers the side surfaces of the fins FC in the Y direction. That is, since the upper surface of the fins FC exposed from the patterns is lower than the upper surface of the fins FA in contact with the epitaxial layers EPS, the amount of growth by epitaxial growth is small. Therefore, the epitaxial layers EP2 covering the respective fins FC adjacent to each other in the short direction of the fin FC are separated from each other. In FIG. 30, the epitaxial layers EP2 do not cover the side surfaces of the fins FC in the X direction, but the side surfaces may be covered by the epitaxial layers EP2. When the side surface of the fin FC in the X-direction is covered with a silicon oxide film or the like, it is considered that the side surface of the fin FC is not covered with the epitaxial layer EP2.

Figure 31:
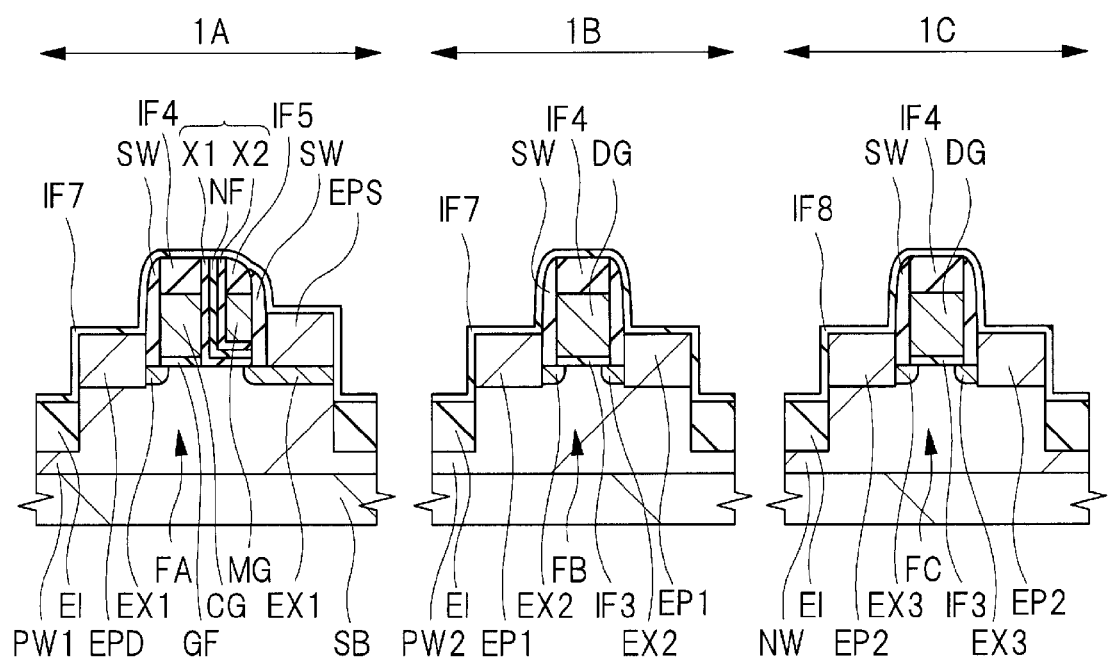
FIG. 31 is a cross-sectional view of the semiconductor device during the manufacturing process following FIG. 30.

Next, as shown in FIG. 31, after the photoresist film PR5 is removed, an insulating film IF8 formed of, for example, a silicon nitride film is formed on the semiconductor substrate SB. The insulating film IF8 can be formed by, for example, CVD method. The insulating film IF8 is formed so as to cover the surface of the insulating film IF7 in the memory cell region 1A and the nMIS region 1B. However, in FIG. 31, the insulating film IF8 in the memory cell region 1A and the nMIS region 1B is omitted because the insulating film IF8 is integrated with the insulating film IF7 in the memory cell region 1A and the insulating film IF7 in the nMIS region 1B.

Figure 32:
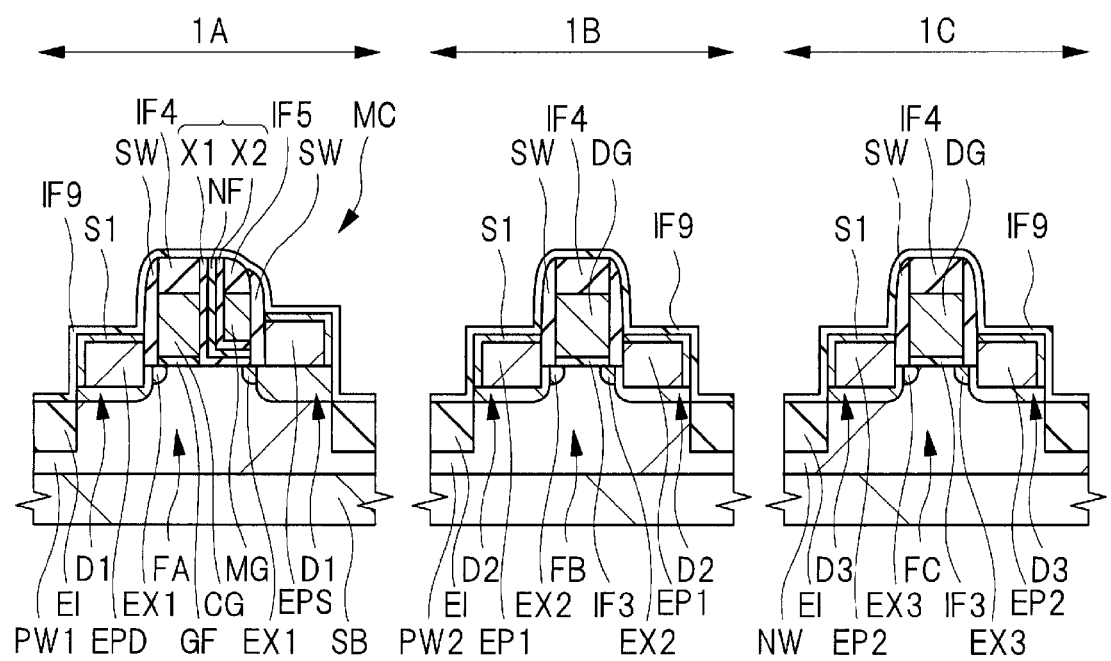
FIG. 32 is a cross-sectional view of the semiconductor device during the manufacturing process following FIG. 31.

Next, as shown in FIG. 32, using the insulating films IF4, IF5, the dummy gate electrodes DG, the control gate electrodes CG, the memory gate electrodes MG, and the sidewall spacers SW as masks, ions are implanted into the respective upper surface of the epitaxial layers EPD, EPS, EP1, EP2, fins FA, FB, and FC. Thus, a pair of diffusion regions D1, which are n-type semiconductor regions, are formed in the fin FA. A pair of diffusion regions D2, which are n-type semiconductor regions, are formed in the fin FB. A pair of diffusion regions D3, which are p-type semiconductor regions, are formed in the fin FC. The diffusion region D1 is also formed in each of the epitaxial layers EPD and EPS, the diffusion region D2 is also formed in the epitaxial layer EP1, and the diffusion region D3 is also formed in the epitaxial layer EP2.

That is, in the memory cell region 1A, among the pair of diffusion regions D1 formed so as to sandwich the control gate electrode CG and the memory gate electrode MG in plan view, one is formed from the surface of the epitaxial layer EPD to the inside of the epitaxial layer EPD and the fin FA including the upper surface and side surfaces of the fin FA. The other of the pair of diffusion regions D1 is formed from the surface of the epitaxial layer EPS to the inside of the epitaxial layer EPS and the fin FA including the upper surface and the side surface of the fin FA. Each of the pair of diffusion regions D2 in the nMIS region 1B is formed from the surface of the epitaxial layer EP1 to the inside of the epitaxial layer EP1 and the inside of the fin FB including the upper surface and the side surface of the fin FB. Each of the pair of diffusion regions D3 in the pMIS region 1C is formed from the surface of the epitaxial layer EP2 to the inside of the epitaxial layer EP2 and the inside of the fin FC including the upper surface and the side surface of the fin FC. Here, in the nMIS region 1B and the pMIS region 1C, impurities are implanted into the fins FB and FC through the insulating films IF7, IF8.

At least the diffusion region D3 is formed in a step different from the step of forming the diffusion regions D1 and D2. The diffusion regions D1 and D2 can be formed by implanting n-type impurities (for example, P (phosphorus) or As (arsenic)). The diffusion region D3 can be formed by implanting p-type impurities (for example, B (boron)). In the step of forming the diffusion regions D1 and D2, ions are implanted with a higher impurity concentration than the ion implantation step performed when forming the extension regions EX1 and EX2. Also, in the step of forming the diffusion region D3, ion implantation is performed with a higher impurity concentration than the ion implantation step performed when forming the extension region EX3. Thus, a source/drain region including the diffusion region D1 and the extension region EX1, a source/drain region including the diffusion region D2 and the extension region EX2, and a source/drain region including the diffusion region D3 and the extension region EX3 are formed.

In the memory cell region 1A, the source/drain region and the control gate electrode CG configure a control transistor, and the source/drain region and the memory gate electrode MG configure a memory transistor. The control transistor and the memory transistor configure a memory cell MC.

Here, although the diffusion regions D1 to D3 are formed after the epitaxial layers EP1, EP2 are formed, the diffusion regions D1 and D2 may be formed, for example, after the sidewall spacers SW described with reference to FIG. 24 are formed and before the etching process described with reference to FIG. 25. The diffusion region D3 may be formed, for example, after the sidewall spacers SW described with reference to FIG. 28 is formed and before the etching process described with reference to FIG. 29.

Subsequently, after the insulating films IF7, IF8 are removed, a silicide layer S1 is formed on the surface (upper surface and side surfaces) of each of the epitaxial layers EPD, EPS, EP1, and EP2 by using a well-known salicide process. A metal film is formed on the upper surface of the semiconductor substrate SB by, for example, sputtering method, and then heat treatment is performed to react the metal film with the surfaces of the epitaxial layers EPD, EPS, EP1, and EP2, thereby forming the silicide layers S1. Thereafter, the metal film is removed. The silicide layer S1 is, for example, a NiPt silicide layer. Subsequently, an insulating film (liner insulating film) IF9 formed of a silicon nitride film is formed on the semiconductor substrate SB by, for example, CVD method.

Figure 33:
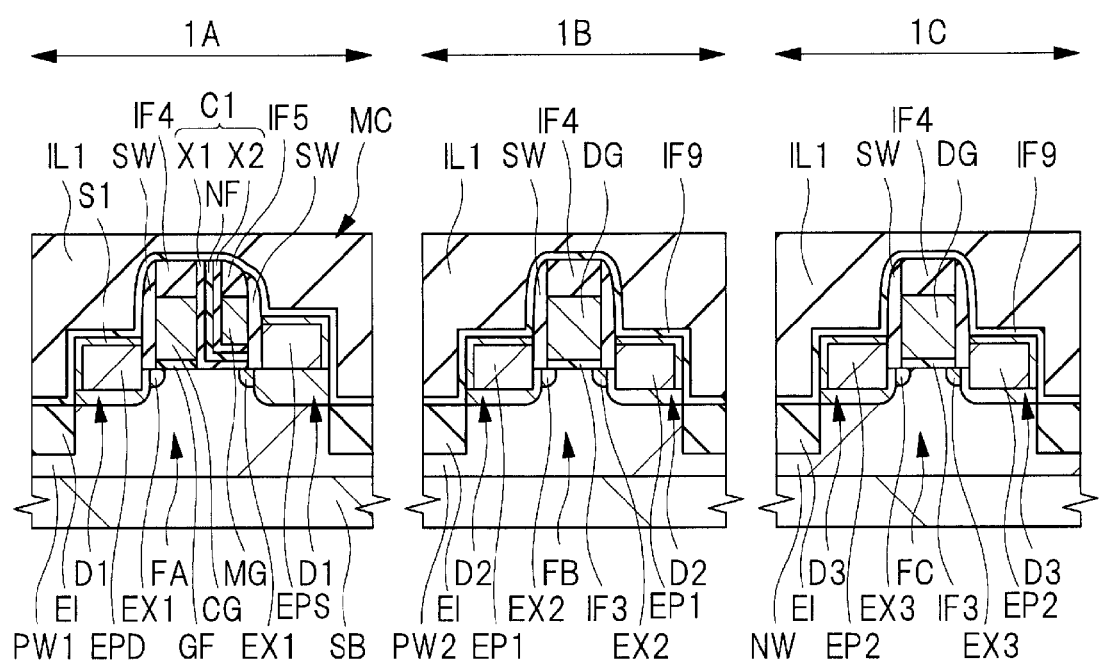
FIG. 33 is a cross-sectional view of the semiconductor device during the manufacturing process following FIG. 32.

Next, as shown in FIG. 33, an interlayer insulating film IL1 formed of a silicon oxide film is formed on the upper surface of the semiconductor substrate SB. The interlayer insulating film IL1 can be formed by, for example, CVD method. The interlayer insulating film IL1 has a film thickness larger than the sum of the height of the fins FA above the element isolation regions EI and the height of the stack structure of the control gate electrodes CG and the insulating films IF4. After that, the upper surface of the interlayer insulating film IL1 is planarized by, for example, CMP method.

Figure 34:
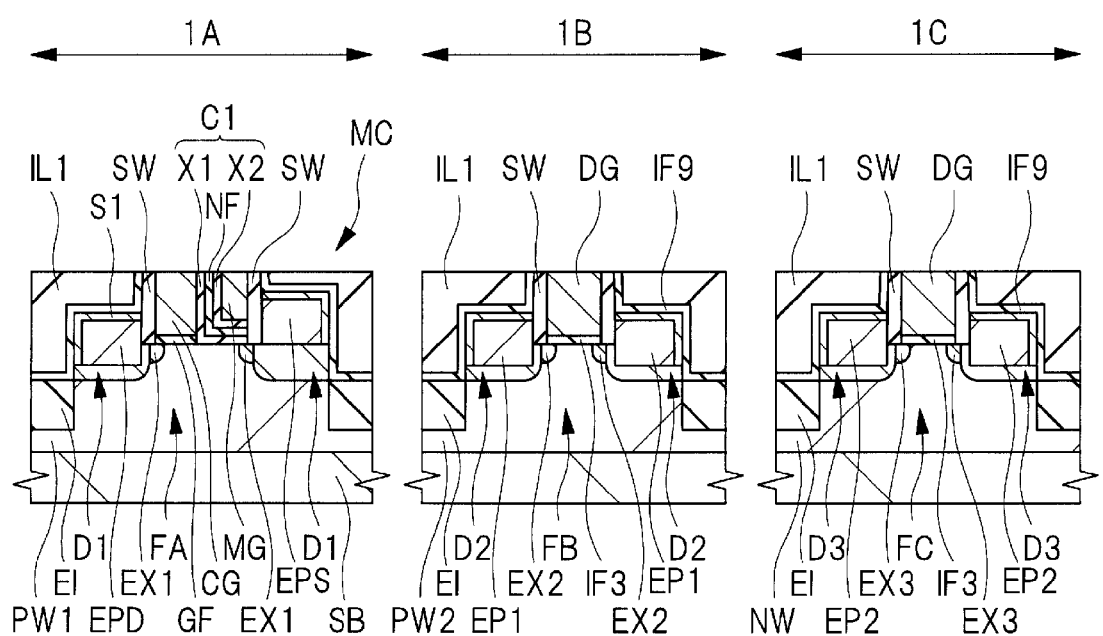
FIG. 34 is a cross-sectional view of the semiconductor device during the manufacturing process following FIG. 33.

Next, as shown in FIG. 34, the upper surfaces of the dummy gate electrodes DG in the nMIS region 1B and the pMIS region 1C are exposed by polishing the upper surface of the interlayer insulating film IL1, the insulating films IF4, IF5, and the sidewall spacers SW by, for example, CMP method. As a result, the insulating films IF4, IF5 are removed, so that the upper surface of each of the control gate electrodes CG and the memory gate electrodes MG is also exposed.

Figure 35:
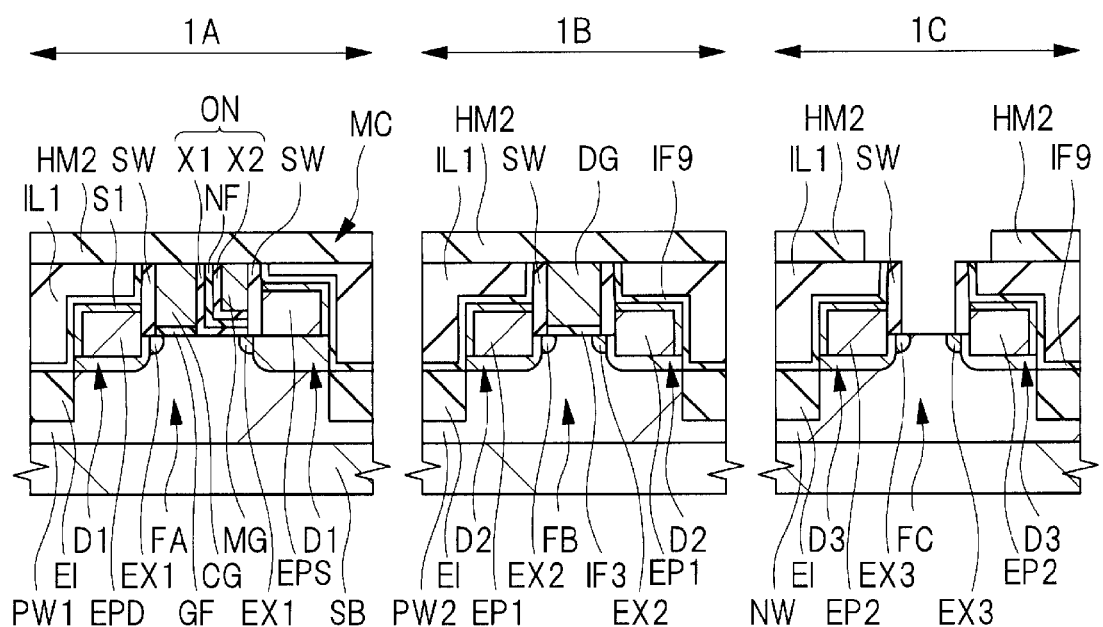
FIG. 35 is a cross-sectional view of the semiconductor device during the manufacturing process following FIG. 34.

Next, as shown in FIG. 35, a step of removing the dummy gate electrodes DG exposed in the pMIS regions 1C is performed. That is, after a hard mask HM2 is formed over the semiconductor substrate SB by, for example, CVD method, the hard mask HM2 in the pMIS region 1C is removed by photolithography and etching, thereby exposing the dummy gate electrodes DG in the pMIS region 1C. The hard mask HM2 is formed of, for example, a silicon oxide film or a titanium nitride (TiN) film, and each of the gate electrodes in the nMIS region 1B and the memory cell region 1A is covered with the hard mask HM2.

Subsequently, the dummy gate electrodes DG exposed from the hard mask HM2 are removed by wet etching. Here, the insulating films IF3 under the dummy gate electrodes DG are also removed, but the insulating films IF3 may be left. After the insulating films IF3 are removed, an insulating film may be formed to cover the bottom surfaces of the trenches formed by removing the dummy gate electrodes DG.

Figure 36:
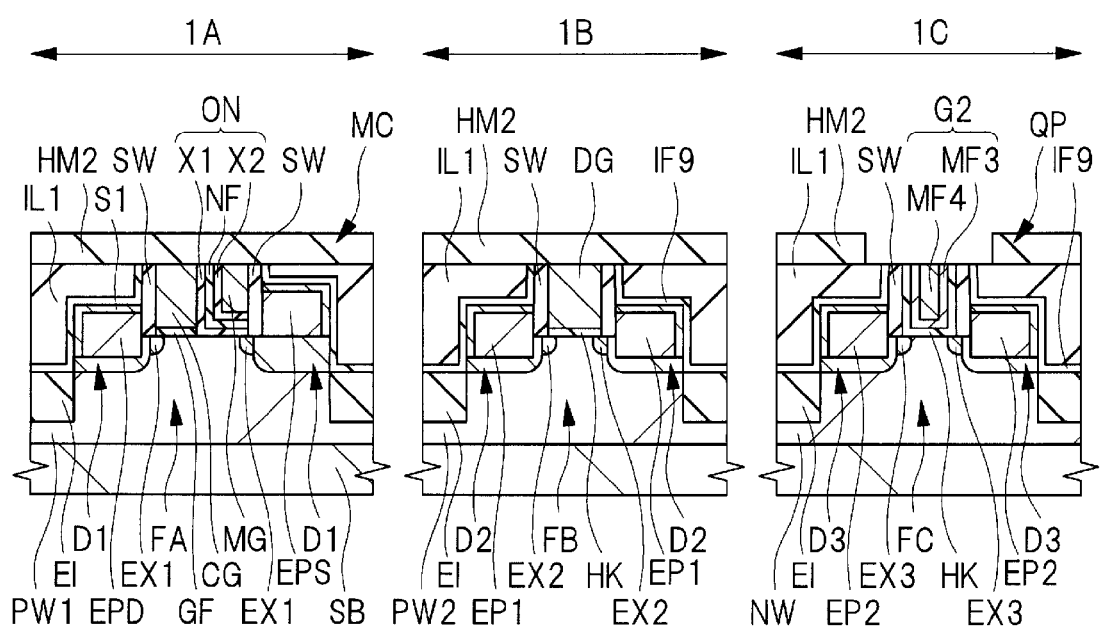
FIG. 36 is a cross-sectional view of the semiconductor device during the manufacturing process following FIG. 35.

Next, as shown in FIG. 36, insulating films HK as gate dielectric films and gate electrodes G2 as metal gate electrodes are formed in the trenches. That is, first, the insulating film HK, the metal film MF3, and MF4 are formed in this order on the semiconductor substrate SB and on the hard mask HM2 by, for example, CVD method and sputtering method. The insulating film HK is a high-k film having a dielectric constant higher than that of the silicon nitride film, and here, the insulating film HK is formed of a hafnium oxide film, however, the insulating film HK may be formed of a metal oxide such as a zirconium oxide film, an aluminum oxide film, a tantalum oxide film, or a lanthanum oxide film.

The metal film MF3 is formed of a titanium nitride (TiN) film here, but a tantalum nitride (TaN) film, a tungsten nitride (WN) film, a titanium carbide (TiC) film, a tantalum carbide (TaC) film, a tungsten carbide (WC) film, a tantalum nitride carbide (TaCN) film, a titanium (Ti) film, a tantalum (Ta) film, a titanium aluminum (TiAl) film, or the like may be used instead. The metal film MF4 is formed of, for example, an aluminum (Al) film.

The trenches formed by removing the dummy gate electrodes DG in the pMIS region 1C are completely embedded with a stacked film formed of the insulating films HK, the metal films MF3 and MF4. Thereafter, an unnecessary film on the interlayer insulating film IL1 is removed by, for example, CMP method to expose the upper surface of the interlayer insulating film IL1 in the pMIS region 1C, thereby forming gate dielectric films formed of the insulating films HK embedded in the trenches and gate electrodes G2 formed of the metal films MF3, MF4 embedded in the trenches. As a result, the p-type transistors QP including the gate electrodes G2 and the source/drain regions in the pMIS region 1C are formed.

Figure 37:
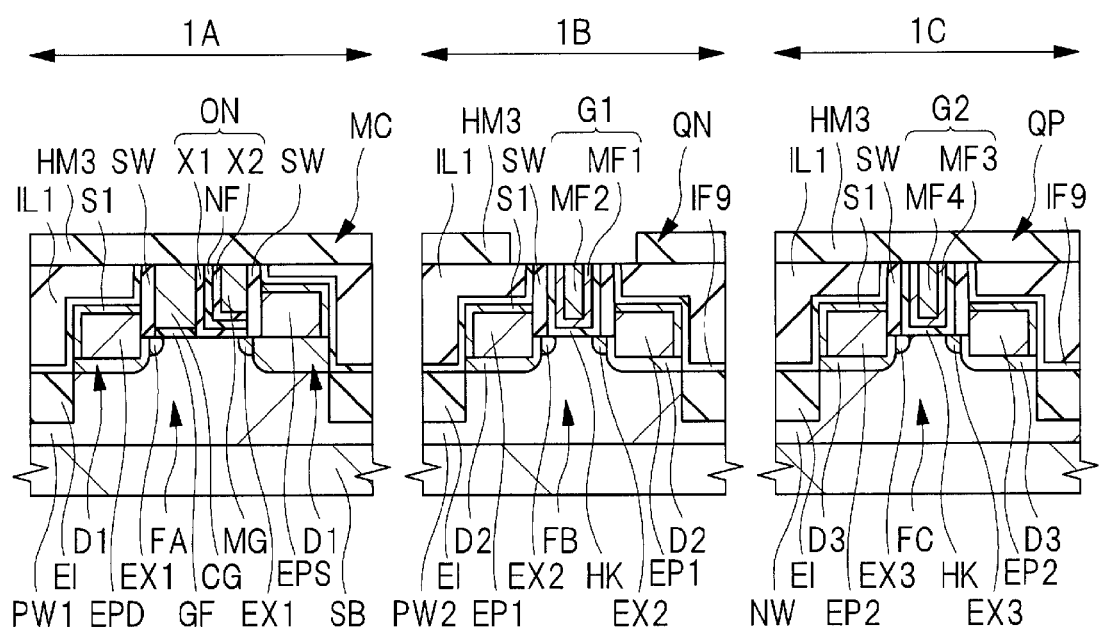
FIG. 37 is a cross-sectional view of the semiconductor device during the manufacturing process following FIG. 36.

Next, as shown in FIG. 37, a step of removing the dummy gate electrodes DG exposed in the nMIS region 1B is performed. That is, the hard mask HM2 is removed, and then a hard mask HM3 is formed over the semiconductor substrate SB by, for example, CVD method, and then the hard mask HM3 in the nMIS region 1B is removed by photolithography and etching, thereby exposing the dummy gate electrodes DG in the nMIS region 1B. The hard mask HM3 is formed of, for example, a silicon oxide film or a titanium nitride (TiN) film, and each of the gate electrodes in the pMIS region 1C and the memory cell region 1A is covered with the hard mask HM3.

Subsequently, the dummy gate electrodes DG exposed from the hard mask HM3 are removed by wet etching. Here, the insulating films IF3 under the dummy gate electrodes DG are also removed, but the insulating films IF3 may be left. After the insulating films IF3 are removed, an insulating film may be formed to cover the bottom surfaces of the trenches formed by removing the dummy gate electrodes DG.

Then, insulating films HK as gate dielectric films and gate electrodes G1 as metal gate electrodes are formed in the trenches. That is, first, the insulating films HK, the metal films MF1 and MF2 are formed in this order on the semiconductor substrate SB and on the hard mask HM3 by, for example, CVD method and sputtering method. The insulating film HK is a high-k film having a dielectric constant higher than that of the silicon nitride film, and here, the insulating film HK is formed of a hafnium oxide film, however, the insulating film HK may be formed of a metal oxide such as a zirconium oxide film, an aluminum oxide film, a tantalum oxide film, or a lanthanum oxide film.

The metal film MF1 is formed of a titanium aluminum (TiAl) film here, but a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbide (TaCN) film, a titanium (Ti) film, a tantalum (Ta) film, or the like may be used instead. The metal film MF2 is formed of, for example, an aluminum (Al) film.

The trenches formed by removing the dummy gate electrodes DG in the nMIS region 1B are completely embedded with a stacked film formed of the insulating films HK, the metal films MF1 and MF2. Thereafter, an unnecessary film on the interlayer insulating film IL1 is removed by, for example, CMP method to expose the upper surface of the interlayer insulating film IL1 in the nMIS region 1B, thereby forming gate dielectric films formed of the insulating films HK embedded in the trenches and gate electrodes G1 formed of the metal films MF1 and MF2 embedded in the trenches. As a result, the n-type transistors QN including the gate electrodes G1 and the source/drain regions in the nMIS region 1B are formed.

Figure 38:
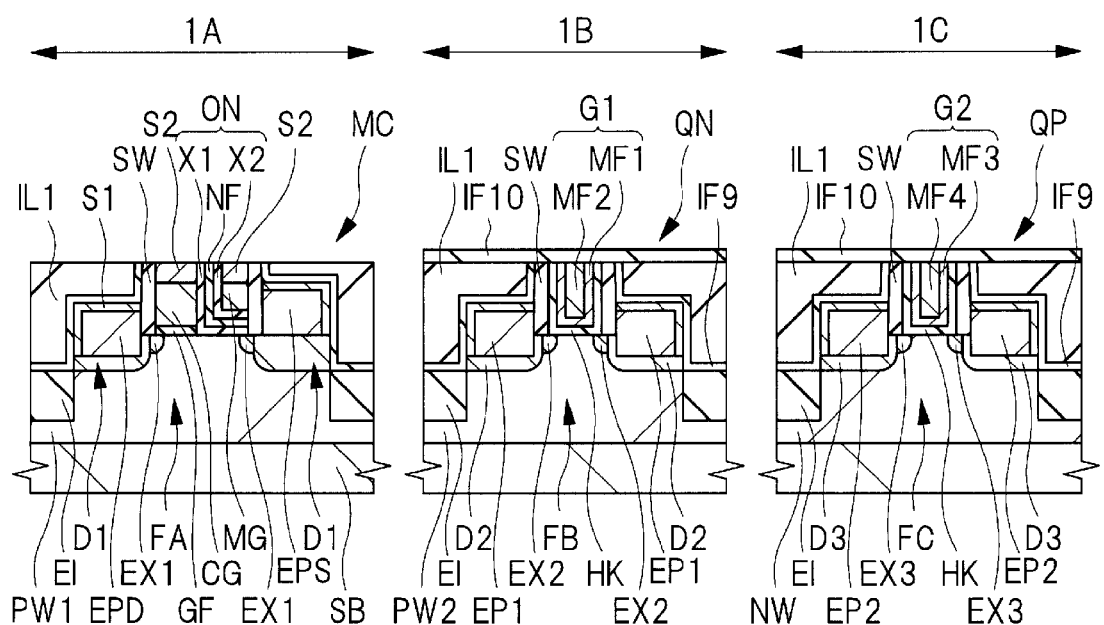
FIG. 38 is a cross-sectional view of the semiconductor device during the manufacturing process following FIG. 37.

Next, as shown in FIG. 38, the hard mask HM3 is removed, and then an insulating film IF10 is formed over the semiconductor substrate SB by, for example, CVD method, and then the insulating film IF10 in the memory cell region 1A is removed by photolithography and etching. Therefore, although the gate electrodes G1 and G2 in the nMIS region 1B and the pMIS region 1C are covered with the insulating film IF10, the control gate electrodes CG and the memory gate electrodes MG are exposed from the insulating film IF10.

Subsequently, a silicide layer S2 is formed on the upper surface of each of the control gate electrodes CG and the memory gate electrodes MG by well-known salicide process. Here, a NiPt film is deposited over the semiconductor substrate SB and the insulating film IF10 by sputtering method, and then a first heat treatment is performed to form silicide layers S2. Subsequently, after the excess NiPt film is removed, a second heat treatment is performed, thereby the low-resistance silicide layers S2 can be formed. The silicide layer S2 is, for example, a NiPt silicide layer.

Figure 39:
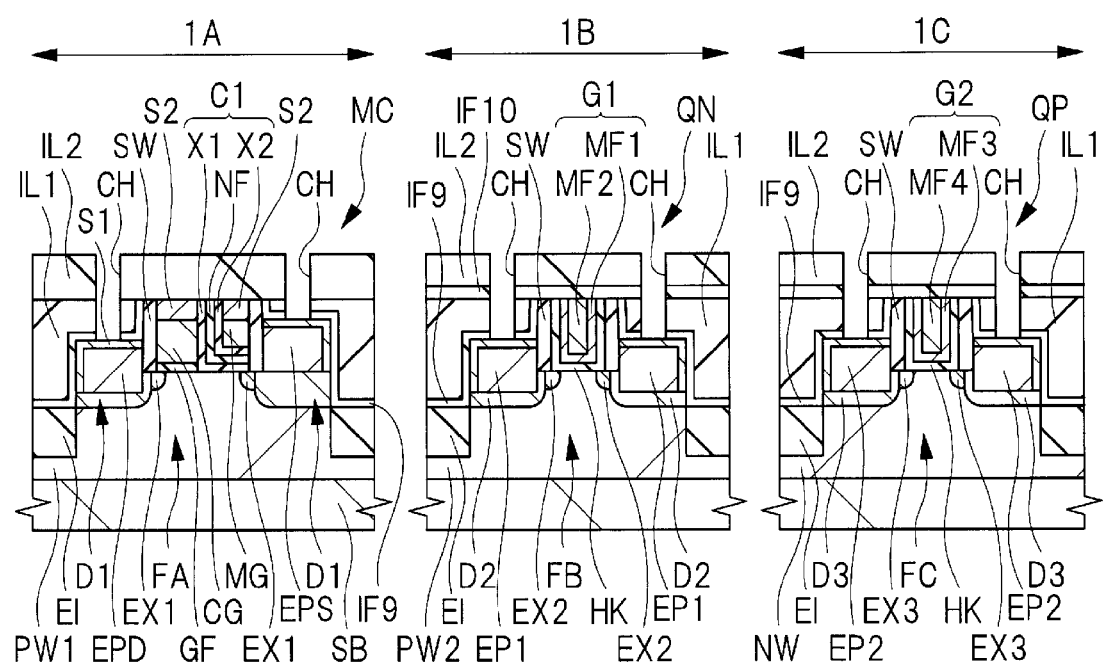
FIG. 39 is a cross-sectional view of the semiconductor device during the manufacturing process following FIG. 38.

Next, as shown in FIG. 39, an interlayer insulating film IL2 is formed over the semiconductor substrate SB and the insulating film IF10 by, for example, CVD method. The interlayer insulating film IL2 is formed of, for example, a silicon oxide film. Subsequently, the upper surface of the interlayer insulating film IL2 is flattened by CMP method or the like. Subsequently, a plurality of contact holes CH penetrating the interlayer insulating films IL1 and IL2 are formed by photolithography and dry etching. The contact holes CH in the nMIS region 1B and the pMIS region 1C also penetrate the insulating film IF10.

In the memory cell region 1A, a part of the silicide layer S1 covering the upper surface of each of the epitaxial layers EPD and EPS, which are part of the source/drain regions, is exposed at the bottom of the contact hole CH. In the nMIS region 1B, a part of the silicide layer S1 covering the upper surface of the epitaxial layer EP1, which is a part of the source/drain region, is exposed at the bottom of the contact hole CH. In the pMIS region 1C, a part of the silicide layer S1 covering the upper surface of the epitaxial layer EP2, which is a part of the source/drain region, is exposed at the bottom of the contact hole CH.

In regions not shown, contact holes CH are formed to expose a part of the upper surface of each of the gate electrodes G1 and G2, the control gate electrodes CG, and the memory gate electrodes MG from the interlayer insulating film IL2. These contact holes CH do not penetrate the interlayer insulating film IL1.

Figure 40:
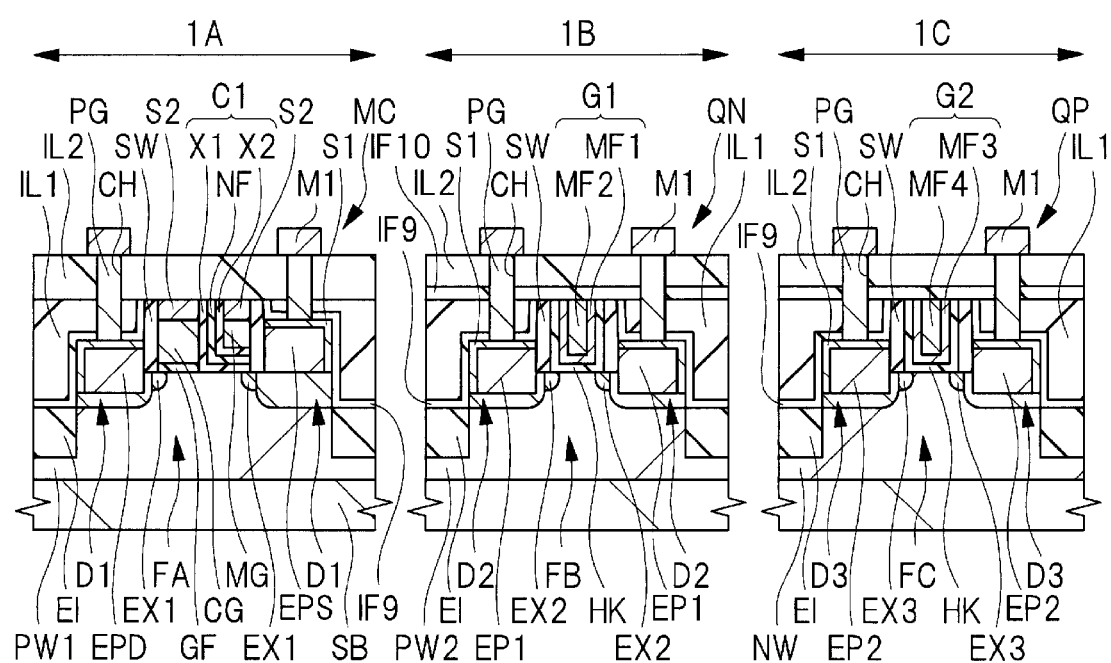
FIG. 40 is a cross-sectional view of the semiconductor device during the manufacturing process following FIG. 39.

Next, as shown in FIG. 40, conductive plugs PG made of tungsten (W) or the like are formed in the contact holes CH as conductive members for connection. Each of the plugs PG has a stacked structure formed of a barrier conductor film (for example, a titanium film, a titanium nitride film, or a stacked film thereof) and a main conductor film (for example, a tungsten film) located on the barrier conductor film.

The plugs PG are electrically connected to the source region and the drain region in the memory cell MC via the silicide layers S1. The plugs PG are embedded in the contact holes CH in the nMIS region 1B, and are electrically connected to the epitaxial layers EP1 via the silicide layers S1. That is, the plugs PG are electrically connected to the source/drain regions of the n-type transistors QN. The plugs PG are embedded in the contact holes CH in the pMIS region 1C, and are electrically connected to the epitaxial layers EP2 via the silicide layers S1. That is, the plugs PG are electrically connected to the source/drain regions of the p-type transistors QP.

Next, wirings M1 are formed on the interlayer insulating film IL2. The wirings M1 have stacked structures of a barrier conductor film (for example, a titanium nitride film, a tantalum film, or a tantalum nitride film) and a main conductor film (a copper film) formed on the barrier conductor film. In FIG. 40, for simplifying of the drawing, the wirings M1 are shown by integrating the barrier conductor film and the main conductor film. The same applies to the plugs PG.

The wirings M1 can be formed by, for example, a so-called single damascene method. That is, the wirings M1 can be formed by forming an interlayer insulating film (not shown) having wiring trenches on the interlayer insulating film IL2 and embedding the wiring trenches with a metal film.

Effects of Method of Manufacturing Semiconductor Device

Next, the main features and effects of the method of manufacturing the semiconductor device of the present embodiment will be described.

As described above with reference to FIG. 42, when a plug (contact plug) is formed on each of all the source/drain regions, the space between the plugs is narrowed by densely arranging the plugs. As shown in FIG. 42, when the epitaxial layers EPSA covering the source regions MS formed on the fins FA adjacent to each other in the Y direction in the memory cell region 1A are separated from each other, the plug PG need to be connected to each of the plurality of epitaxial layers EPSA arranged in the Y direction. As a result, the plugs PG are densely formed as described above. It is difficult to arrange the plugs PG at a fine pitch, and non-opening of the contact holes CH in which the plugs PG are formed tends to occur. That is, in the etching process of forming the contact holes CH (see FIG. 39), a defect in which the contact holes CH do not reach the epitaxial layers EPS or the like is apt to occur. As a result, plug formation defects are likely to occur, which causes a problem that the reliability of the semiconductor device is lowered. Bits with poor plug formation become defective bits, resulting in poor device yield.

Therefore, in the method of manufacturing the semiconductor device of the present embodiment, by utilizing the fact that the quantity of epitaxial growth differs depending on the height of the fins, the source lines are made common by the epitaxial layers. That is, as shown in FIG. 25, in the memory cell region 1A, by selectively retracting the upper surface of the fin FA on the side of the control gate electrode CG downward, the upper surface of the fin FA on the side of the memory gate electrode MG is made higher than the upper surface of the fin FA on the side of the control gate electrode CG. As a result of performing epitaxial growth using the fin FA as a base, the epitaxial layer EPS grows larger in the lateral direction as compared with the epitaxial layer EPD shown in FIG. 26 (see FIG. 4).

Therefore, as shown in FIG. 1, the epitaxial layers EPD covering the drain regions MD formed in the plurality of fins FA arranged in the Y direction are separated from each other, whereas the epitaxial layers EPS covering the source regions MS formed in the plurality of fins FA arranged in the Y direction are integrated and in contact with each other. That is, the plurality of source regions MS are connected in parallel via the epitaxial layer EPS.

Therefore, the source potential can be supplied to the source regions MS via one epitaxial layer EPS without disposing the plugs PG directly on all the source regions MS arranged in the Y direction. Therefore, the arrangement of the plugs PG connected to the source/drain regions can be made sparse. As a result, the occurrence of defective plug formation can be prevented, and the reliability of the semiconductor device can be improved.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
a semiconductor substrate having a memory cell region;
a plurality of first protruding portions being part of the semiconductor substrate in the memory cell region, protruded from an upper surface of the semiconductor substrate, extending in a first direction along the upper surface of the semiconductor substrate and arranged in a second direction intersecting with the first direction;
a control gate electrode formed on an upper surface and a side surface of each of the first protruding portions to sandwich a first dielectric film between the control gate electrode and the upper surface and the side surface of each of the first protruding portions, the control gate electrode extending in the second direction;
a memory gate electrode formed on the upper surface and the side surface of each of the first protruding portions to sandwich a second dielectric film between the memory gate electrode and the upper surface and the side surface of each of the first protruding portions, the second dielectric film having a charge storage portion, the memory gate electrode being adjacent to one side surface of the control gate electrode to sandwich a third dielectric film between the memory gate electrode and the one side surface of the control gate electrode, the memory gate electrode extending in the second direction;
a first drain region formed in each of the first protruding portions adjacent to the control gate electrode in plan view;
a first source region formed in each of the first protruding portions adjacent to the memory gate electrode in plan view;
a first semiconductor layer formed on the upper surface and the side surface of each of the first protruding portions in which the first drain region is formed, and electrically connected to the first drain region; and
a second semiconductor layer formed on the upper surface and the side surface of the first protruding portions in which the first source region is formed, and electrically connected to the first source region,
wherein the control gate electrode, the memory gate electrode, the first drain region and the first source region configure a nonvolatile memory element,
wherein the first semiconductor layers adjacent in the second direction are separated from each other, and
wherein the second semiconductor layers adjacent in the second direction are connected to each other.

2. The semiconductor device according to claim 1, wherein the upper surface of the first protruding portion in contact with the second semiconductor layer is higher than the upper surface of the first protruding portion in contact with the first semiconductor layer.

3. The semiconductor device according to claim 2, wherein the number of plugs penetrating through an interlayer insulating film covering the second semiconductor layer, arranged on the second semiconductor layer and electrically connected to the second semiconductor layer is less than the number of the plurality of first protruding portions covered by the second semiconductor layers.

4. The semiconductor device according to claim 2, comprising:
a plurality of second protruding portions being part of the semiconductor substrate in a logic circuit region different from the memory cell region, protruded from the upper surface of the semiconductor substrate, extending in a third direction along the main surface of the semiconductor substrate and arranged in a fourth direction intersecting with the third direction;
a gate electrode formed on an upper surface and a side surface of the second protruding portion to sandwich a fourth dielectric film between the gate electrode and the upper surface and the upper surface and the side surface of the second protruding portion, the gate electrode extending in the fourth direction;
a second source region and a second drain region formed from the upper surface and the side surface of the second protruding portion to an inside of the second protruding portion so as to sandwich the gate electrode in plan view; and
a third semiconductor layer covering the upper surface and the side surface of each of portions of the second protruding portion where the second source region and the second drain region are formed, and in contact with the plurality of second protruding portions,
wherein the gate electrode, the second source region and the second drain region configure a field effect transistor, and
wherein the third semiconductor layers in contact with the second protruding portions adjacent in the fourth direction are separated from each other.

5. The semiconductor device according to claim 4, wherein the upper surface of the first protruding portion in contact with the second semiconductor layer is higher than the upper surface of the second protruding portion in contact with the third semiconductor layer.

6. The semiconductor device according to claim 2, wherein an upper surface and a side surface of each of the first semiconductor layer and the second semiconductor layer are covered with silicide layers.

7. The semiconductor device according to claim 2, wherein the first semiconductor layers in contact with the plurality of first protruding portions arranged in the second direction are separated from each other.

8. The semiconductor device according to claim 2,
wherein a first distance from the side surface of the first protruding portion to an end portion of the first semiconductor layer in the second direction is less than ½ of a distance between the adjacent first protruding portions, and
wherein a second distance from the side surface of the first protruding portion to an end portion of the second semiconductor layer in the second direction is ½ or more of the distance between the adjacent first protruding portions.

* * * * *